(12) United States Patent
Tan et al.

(10) Patent No.: US 11,868,051 B2
(45) Date of Patent: Jan. 9, 2024

(54) PROGRAMMABLE NANOLITHOGRAPHY MASK

(71) Applicant: Massachusetts Institute of Technology, Cambridge, MA (US)

(72) Inventors: Aik Jun Tan, Boston, MA (US);
Mantao Huang, Cambridge, MA (US);
Geoffrey S. D. Beach, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 4 days.

(21) Appl. No.: 17/995,230

(22) PCT Filed: Apr. 2, 2021

(86) PCT No.: PCT/US2021/025612
§ 371 (c)(1),
(2) Date: Sep. 30, 2022

(87) PCT Pub. No.: WO2021/203021
PCT Pub. Date: Oct. 7, 2021

(65) Prior Publication Data
US 2023/0221650 A1    Jul. 13, 2023

Related U.S. Application Data

(60) Provisional application No. 63/003,944, filed on Apr. 2, 2020.

(51) Int. Cl.
*G03F 7/20* (2006.01)
*G03F 7/00* (2006.01)

(52) U.S. Cl.
CPC ............... *G03F 7/70291* (2013.01)

(58) Field of Classification Search
CPC .................................. G03F 7/70291
See application file for complete search history.

(56) References Cited

U.S. PATENT DOCUMENTS

| 10,761,397 B2 | 9/2020 | Beach et al. |
| 2004/0150865 A1 | 8/2004 | Chen et al. |

(Continued)

FOREIGN PATENT DOCUMENTS

GB    2431732 A    5/2007

OTHER PUBLICATIONS

Armitage et al., Solid-state gadolinium-magnesium hydride optical switch, 1999, Appl. Phys. Lett. 75, 1863 (Year: 1999).*

(Continued)

*Primary Examiner* — Steven Whitesell Gordon
(74) *Attorney, Agent, or Firm* — Smith Baluch LLP

(57) ABSTRACT

Conventional optical lithography uses masks with static patterns that are expensive and labor intensive to produce. The present disclosure is directed to a programmable optical lithography mask with an array of cells that use a hydrogen-mediated mechanism to tune their optical properties (e.g., transmission, absorption, refractive index, and/or reflectivity) dynamically and reversibly. Each cell in the programmable mask may be individually addressable to produce a large variety of patterns. The programmable mask may be configured for ultra-fine spatial resolution or coarse spatial resolution, facilitating a wide range of applications. The programmable mask may be stable against short wavelength light, such as broadband ultraviolet (UV) light, and can thus act as a light valve for short wavelength light.

18 Claims, 22 Drawing Sheets

(56) References Cited

U.S. PATENT DOCUMENTS

| | | | |
|---|---|---|---|
| 2007/0103612 A1* | 5/2007 | Lumpkin | G03F 7/70291 349/42 |
| 2008/0245975 A1* | 10/2008 | Miller | G03F 7/70291 355/43 |
| 2009/0123801 A1 | 5/2009 | Yamamoto et al. | |
| 2012/0014165 A1 | 1/2012 | Kozicki | |
| 2018/0364544 A1* | 12/2018 | Beach | G02F 1/19 |
| 2019/0172998 A1 | 6/2019 | Tan et al. | |
| 2021/0041761 A1 | 2/2021 | Beach et al. | |

OTHER PUBLICATIONS

Huang et al., "Voltage-gated optics and plasmonics enabled by solid-state proton pumping." Nature communications 10.1 (2019): 1-8.

Huiberts et al., "Yttrium and lanthanum hydride films with switchable optical properties." Nature 380.6571 (1996): 231-234.

International Search Report and Written Opinion in International Patent Application No. PCT/US2021/025612 dated Sep. 17, 2021, 11 pages.

Sterl et al., "Magnesium as novel material for active plasmonics in the visible wavelength range." Nano Letters 15.12 (2015): 7949-7955.

* cited by examiner

PROGRAMMABLE NANOLITHOGRAPHY MASK

CROSS-REFERENCE TO RELATED APPLICATION(S)

This application is a US National Stage filing under 35 U.S.C. 371, of International Application No. PCT/US2021/025612, entitled "PROGRAMMABLE NANOLITHOGRAPHY MASK," filed on Apr. 2, 2021, which claims the priority benefit, under 35 U.S.C. 119(e), of U.S. Application No. 63/003,944, which was filed on Apr. 2, 2020. Each of these applications is incorporated herein by reference in its entirety.

BACKGROUND

In semiconductor lithography, a conventional lithography mask provides a static pattern once manufactured. The spatial resolution of a conventional lithography mask is typically on the order of 1-2 µm. If a new pattern design is desired, a new lithography mask is typically fabricated, which can be expensive and have long manufacturing lead times. Unlike conventional lithography masks, a programmable lithography mask provides a dynamically reconfigurable pattern to generate new designs at will while maintaining high throughput. A programmable nanolithography mask may reduce costs and lead time by enabling new mask designs using a single lithography mask. Programmable nanolithography masks may be used for prototyping and short-run fabrication of a range of devices. Programmable nanolithography masks may also be used for volume production.

Previous programmable lithography masks have been demonstrated utilizing a liquid crystal as a light valve with a spatial resolution limited to at least tens of micrometers. However, the exposure of a liquid crystal to ultraviolet (UV) light gradually degrades the liquid crystal, shortening the lifespan of the mask. Programmable masks have also been demonstrated utilizing established electrochromic materials such as $WO_3$. However, the complex material structure (the stack has an ion storage layer, an electrolyte, and a functional layer) makes it difficult to provide high transmission because of the different absorption properties of the layers. Because of the complexity of these layered structures, the programmable mask thickness is usually greater than 1 µm. The spatial resolution of the programmable mask is correlated with its thickness due to aspect ratio and fringing field constraints and is usually no less than 1 µm.

SUMMARY

A programmable mask utilizes a hydrogen-mediated composition change mechanism to dynamically tune the optical properties (e.g., reflectance, absorptance) of one or more cells (also referred to as pixels) in the programmable mask. Each cell in the programmable mask may have a stack structure formed (in order from top to bottom) by a top electrode (e.g., Au), a proton conducting electrolyte (e.g., $GdO_x$), a hydrogen loading layer (e.g., Mg), and a bottom electrode. The top electrode is in close contact with a moisture source, such as a gas environment or a moisture storage layer. The programmable mask may be arranged in a crossbar array configuration with multiple top electrodes and bottom electrodes such that each pair of top and bottom electrodes addresses a single cell.

Each cell may be opaque (e.g., absorptive and/or reflective) in an off state and transparent in an on state. Applying a positive gate voltage across the top and bottom electrodes (positive being measured from the top electrode to the bottom electrode) switches the cell from off to on. During a transition from an off state to an on state, the interface between the top electrode and the proton conducting electrolyte may split water originating from a reservoir (e.g., an environment with a controlled water vapor content or a water storage layer) to form hydrogen ions (protons) and oxygen gas. The electric field generated by the gate voltage may then transport the hydrogen ions towards and into the hydrogen loading layer. The increase in hydrogen content causes the hydrogen loading layer to undergo a chemical composition change (e.g., from magnesium to magnesium hydride), resulting in a change in the optical properties of the hydrogen loading layer (e.g., from reflective to transparent) and the cell (e.g., from opaque to transparent). Once a cell is switched to an on state, the cell may retain this state even without the application of a gate voltage. This process may be reversible upon application of a negative gate voltage.

The programmable mask may overcome several of the limitations of previous programmable masks. First, the programmable mask may achieve a very fine spatial resolution due, in part, to the small number of layers and the thicknesses of each layer. The small number of layers and thinness of each layer establish a total mask thickness on the order of tens of nanometers. The resolution of the programmable mask may depend on an aspect ratio, defined as the total thickness of the programmable mask to the lateral dimension of a cell in the programmable mask. If the aspect ratio is too large, the electric field generated across each cell may be distorted due to an appreciable fringe field, which can affect adjacent cells as crosstalk. By using fewer, thinner layers in the programmable mask, the aspect ratio may be kept small, resulting in a finer spatial resolution. Therefore, the spatial resolution of the programmable mask may be as small as several nanometers. Second, the programmable mask may be stable against short wavelength light, such as broadband ultraviolet (UV) light, and can thus act as a light valve for short wavelength light when gated unlike previous programmable masks based on liquid crystal light valves.

The programmable mask may provide a pathway towards dynamic programming of any optical lithography mask or any applications that use spatially varying modulation of light. Furthermore, while the programmable mask may facilitate ultra-high resolution, the programmable mask may also be scaled for lower resolution applications such as packaging and labelling. The programmable mask may also be used as a standalone device for spatial light modulation. Such a spatial light modulation device may provide wavefront forming and beam steering. The spatial light modulation device may have applications in, for example, projectors and holographic displays. The spatial light modulation device may provide smaller pixel pitch (e.g., on the order of tens of nanometers) compared to existing spatial light modulators that use liquid crystals (with a pixel pitch of about 3 µm) and/or micromirrors (with a pixel pitch of about 5 µm). A small pixel pitch may provide finer spatial resolution and a higher diffraction angle for beam steering and hologram generation.

Embodiments of the present technology include a reconfigurable mask. The reconfigurable mask includes a first electrode, a second electrode, a third electrode, a hydrogen loading layer, and a proton-conducting electrolyte. The hydrogen loading layer is disposed between the first electrode and the second electrode and between the first electrode and the third electrode. The hydrogen loading layer includes a first hydrogen loading region and a second hydrogen loading region. The first hydrogen loading region is disposed between the first electrode and the second electrode. The first hydrogen loading region has a first transmission, absorption, phase shift, and/or reflectivity that varies with a first concentration of hydrogen ions in the first hydrogen loading region. The second hydrogen loading region is disposed between the first electrode and the third electrode. The second hydrogen loading region has a second transmission, absorption, phase shift, and/or reflectivity that varies with a second concentration of hydrogen ions in the second hydrogen loading region. The proton-conducting electrolyte is disposed between the first electrode and the second electrode and between the first electrode and the third electrode. The proton-conducting electrolyte includes a first proton conducting region and a second proton conducting region. The first proton conducting region is disposed between the first electrode and the second electrode. The first proton conducting region defines a first interface in direct contact with one of the first electrode and the second electrode. The second proton conducting region is disposed between the first electrode and the third electrode. The second proton conducting region defines a second interface in direct contact with one of the first electrode and the third electrode.

The first interface in direct contact with one of the first electrode and the second electrode may be configured to split water into oxygen and hydrogen ions in response to a first voltage. The first voltage may be applied across the first electrode and the second electrode. The first voltage may generate a first electric field. At least some of the hydrogen ions from the water splitting may propagate towards the first hydrogen loading region via at least one of the first electric field or diffusion. The propagation of the hydrogen ions may change the first concentration of hydrogen ions in the first hydrogen loading region and the first transmission, absorption, phase shift, and/or reflectivity of the first hydrogen loading region.

The second interface in direct contact with one of the first electrode and the third electrode may be configured to split water into oxygen and hydrogen ions in response to a second voltage. The second voltage may be applied across the first electrode and the third electrode. The second voltage may generate a second electric field. At least some of the hydrogen ions from the water splitting may propagate towards the second hydrogen loading region via at least one of the second electric field or diffusion. The propagating hydrogen ions may change the second concentration of hydrogen ions and the second transmission, absorption, phase shift, and/or reflectivity of the second hydrogen loading region.

The reconfigurable mask may further include a voltage source in electrical communication with the first electrode, the second electrode, and the third electrode. The voltage source may apply a first voltage and a second voltage. The first voltage may be equal to a sum of a first terminal voltage applied to the first electrode and a second terminal voltage applied to the second electrode. The second voltage may be equal to a sum of the first terminal voltage and a third terminal voltage applied to the third electrode.

The first voltage may be a loading voltage to change the first optical property by splitting water at the first interface. The first voltage may be an idle voltage to hold the first optical property constant by preventing a change in the first concentration of hydrogen ions. The first voltage may be an unloading voltage to change the first optical property by recombining the oxygen and the hydrogen ions into water at the first interface. The loading voltage may be greater than about 2.5 V. The idle voltage may be between about 0 V and about 2.5 V. The unloading voltage may be less than about 0 V. The first voltage may be the loading voltage and the second voltage may be the idle voltage to hold the second optical property constant by preventing a change in the second concentration of hydrogen ions in the second hydrogen loading region.

The first electrode of the reconfigurable mask may be orthogonal to the second electrode. The second electrode of the reconfigurable mask may be parallel to the third electrode. The second electrode and the third electrode may have identical widths. The second electrode and the third electrode may be separated by a distance less than about 100 nm such that a ratio of the distance to the width of the second electrode and the third electrode is less than 1:1. The first electrode, the second electrode, and the third electrode may each have a width ranging between about 10 nm and about 100 µm. The hydrogen loading layer and the solid electrolyte may form a stack having a thickness between about 10 nm and about 200 nm. The first electrode, the second electrode, and the third electrode may each have a thickness less than about 100 nm.

The first transmission, absorption, phase shift, and/or reflectivity and the second transmission, absorption, phase shift, and/or reflectivity may correspond to a wavelength less than about 700 nm. The first electrode or the second electrode and the third electrode may be in direct contact with a water source. The water source may be one of a controlled atmosphere or a water storage layer.

Another embodiment of the present technology includes a lithography system. The lithography system includes a light source, a photoresist, and a reconfigurable mask as described above. The light source emits light. The photoresist receives a first portion of the light. The reconfigurable mask is disposed between the light source and the photoresist. The reconfigurable mask receives the light and transmits the first portion of the light. The first portion of the light corresponds to the light transmitted through the first and second hydrogen loading regions. The second electrode and the third electrode of the reconfigurable mask are separated by a gap. The gap is at least one of (1) sufficiently small such that a second portion of the light is transmitted through the gap with an intensity insufficient to change a chemical structure of the photoresist or (2) filled with a material that prevents the transmission of the second portion of the light.

Another embodiment of the present technology includes a method of generating a pattern in a reconfigurable mask. The reconfigurable mask includes a plurality of first electrodes, a plurality of second electrodes, a solid electrolyte layer, and a hydrogen loading layer. The method includes A) selecting a first electrode in the plurality of first electrodes. The method also includes B) applying a loading voltage across a first plurality of electrode pairs. Each electrode pair in the first plurality of electrode pairs includes the first electrode and a second electrode selected from one or more second electrodes in the plurality of second electrodes according to the pattern. While applying the loading voltage, the method includes C) applying an idle voltage across a second plurality of electrode pairs. Each electrode pair in the second plurality of electrode pairs includes one of the remaining electrodes in the plurality of first electrodes and one of the remaining electrodes in the plurality of second electrodes. In response to applying the loading voltage, the method includes D) splitting water into oxygen and hydrogen ions at interfaces defined between the solid electrolyte layer and the plurality of first electrodes. The interfaces correspond to portions of the solid electrolyte layer disposed between the first electrode and the one or more second electrodes. The method also includes E) applying an electric field based on the loading voltage to drive the hydrogen ions towards portions of the hydrogen loading layer corresponding to the portions of the solid electrolyte layer. The hydrogen ions cause a change in the optical properties of the portions of the hydrogen loading layer.

The method of generating a pattern in a reconfigurable mask may also include F) selecting another first electrode in the plurality of first electrodes and repeating steps B) through E). the method may also include G) repeating step F) until each electrode in the plurality of first electrodes is selected. The loading voltage may be a voltage pulse that increases the change in the optical properties of the portions of the hydrogen loading layer in E). The method may further include H) repeating steps A) through G) until the change in the optical properties of the portions of the hydrogen loading layer in E) exceeds a threshold. The voltage pulse may have a magnitude greater than about 8 V and a duration less than about 10 milliseconds. The ratio of the pulse width of the voltage pulse to the cycle time may be at least 10:1.

The loading voltage may be a direct current (DC) voltage applied until the change in the optical properties of the portions of the hydrogen loading layer in E) exceeds a threshold. The loading voltage may have a magnitude greater than about 2.5 V. The hydrogen loading layer may be a patterned layer comprising a plurality of hydrogen loading regions. A hydrogen loading region in the plurality of hydrogen loading regions may be disposed between each electrode pair in the first plurality of electrode pairs. A hydrogen loading region in the plurality of hydrogen loading regions may be disposed between each electrode pair in the second plurality of electrode pairs. The plurality of hydrogen loading regions may be distinct and unconnected.

Another embodiment of the present technology includes reconfigurable mask. The reconfigurable mask includes a first electrode, a second electrode, a third electrode, and a hydrogen loading layer. The hydrogen loading layer is disposed between the first electrode and the second electrode and between the first electrode and the third electrode. The hydrogen loading layer includes a first hydrogen loading region and a second hydrogen loading region. The first hydrogen loading region is disposed between the first electrode and the second electrode. The first hydrogen loading region has a first optical property that varies with a first concentration of hydrogen ions in the first hydrogen loading region. The second hydrogen loading region is disposed between the first electrode and the third electrode. The second hydrogen loading region has a second optical property that varies with a second concentration of hydrogen ions in the second hydrogen loading region.

The hydrogen loading layer may be a patterned layer. The first hydrogen loading region and the second hydrogen loading region may be noncontinuous and unconnected. The first electrode may be configured to split water into oxygen and hydrogen ions in response to a first voltage applied across the first electrode and the second electrode. The first voltage may generate a first electric field to drive the hydrogen ions towards the first hydrogen loading region. The movement of hydrogen ions towards the first hydrogen loading region may change the first concentration of hydrogen ions in the first hydrogen loading region and the first optical property of the first hydrogen loading region. The first electrode may be configured to split water into oxygen and hydrogen ions in response to a second voltage applied across the first electrode and the third electrode. The second voltage may generate a second electric field to drive the hydrogen ions towards the second hydrogen loading region. The movement of the hydrogen ions may change the second concentration of hydrogen ions in the second hydrogen loading region and the second optical property of the second hydrogen loading region.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. Terminology explicitly employed herein that also may appear in any disclosure incorporated by reference should be accorded a meaning most consistent with the particular concepts disclosed herein.

BRIEF DESCRIPTION OF DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

The programmable mask may be formed as a stack structure comprising a substrate, voltage-controlled transmission switching cells (also referred to herein as pixels), row and column connections, and peripheral electronics for passive addressing. The programmable mask may also include an optical system, positioning stage, and other accessories to form a photolithography system.

Structure of Voltage-Controlled Transmission Cells

Figure 1:
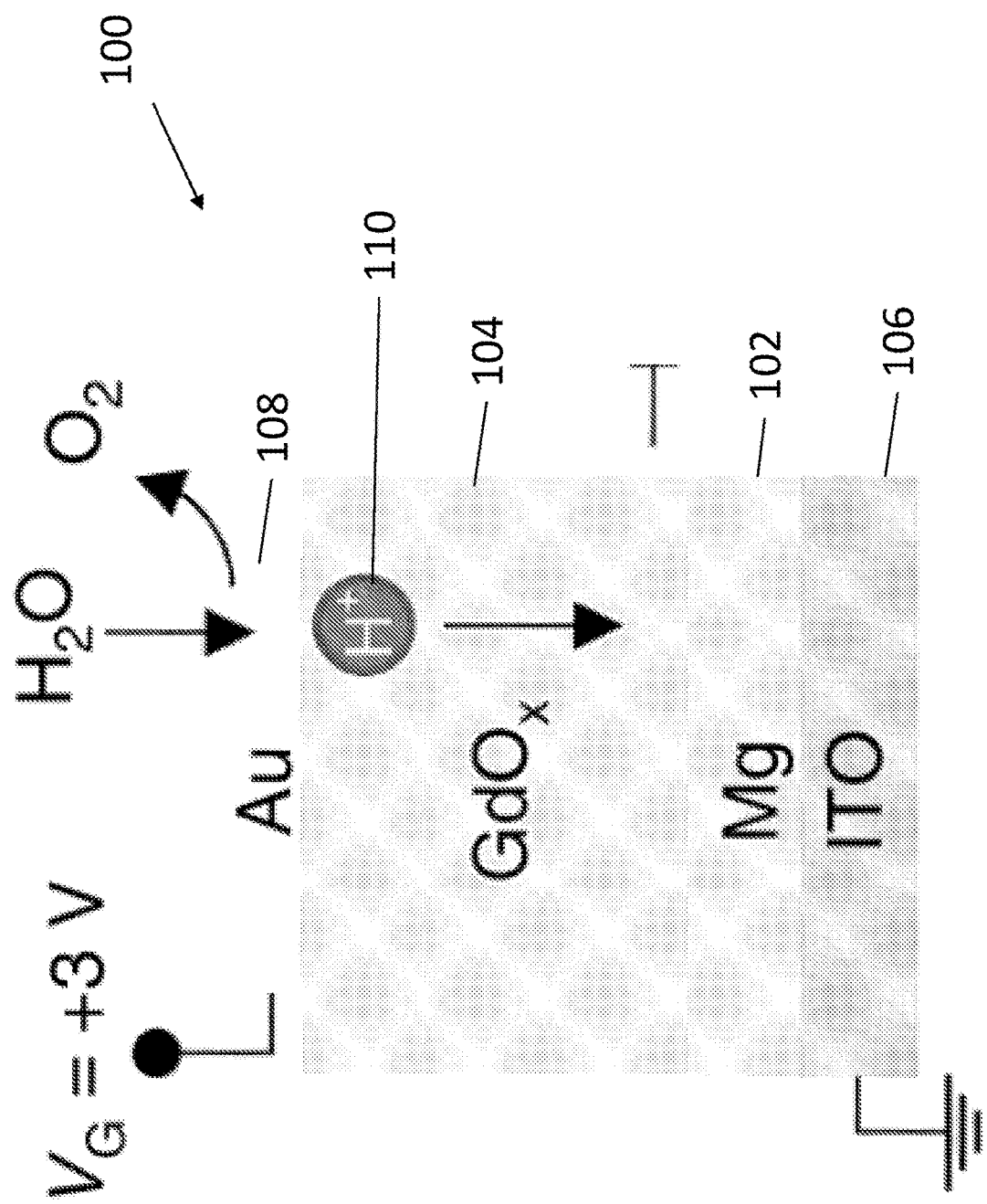
FIG. 1 shows a cross-sectional view of an exemplary stack structure of a cell in a programmable mask.

FIG. 1 shows a stack structure of a cell 100 in a programmable mask including a hydrogen loading layer 102, a proton-conducting electrolyte 104, which is usually an oxide, and bottom 106 and top 108 electrodes layers sandwiching the hydrogen loading layer 102 and the proton-conducting electrolyte 104. The stack may be deposited on a substrate, e.g., with low absorption at the photolithography operational wavelengths. The substrate may also have a low thermal expansion coefficient. Examples of materials that can be used as substrates are alumina, silicon dioxide (e.g., quartz glass), and titanium-doped silica glass.

The hydrogen-loading layer 102 (also referred to as the active layer) is a functional layer whose optical properties (e.g., refractive index, complex dielectric permittivity, reflectivity, transmissivity, absorptivity) change depending on whether hydrogen is loaded in the layer or not. For instance, if one starts with a magnesium layer as the hydrogen loading layer, the layer is initially in a reflective state due to its metallic nature. As hydrogen is loaded into the layer, one or more optical properties of the layer gradually change. The hydrogen-loading process may turn at least some of the magnesium into magnesium hydride, which is a dielectric that is transparent to a broad band of light. The hydrogen-loading layer 102 with hydrogen loaded into the layer may be transparent to a broad band of light, e.g., at wavelengths greater than about 200 nm.

The hydrogen loading layer 102 may also be formed from other materials that support insertion of hydrogen ions 110 or atomic hydrogen into the material, including, but not limited to tungsten oxide ($WO_x$), titanium oxide ($TiO_x$), gadolinium oxide ($GdO_x$) where x has a value of 0 to about 3.5, alloys of magnesium and nickel ($Mg_xNi_y$), alloys of magnesium and cobalt ($Mg_xCo_y$), and alloys of magnesium and rare earth (RE) elements ($Mg_xRE_y$), where x+y=1. Different materials may provide transparency windows for different wavelength ranges. For example, a material may be chosen to have a transparency window that occurs at wavelengths less than about 700 nm. Thus, the choice of the material may depend, in part, on the desired wavelength range of operation for the programmable mask. The hydrogen loading layer 102 may have a thickness ranging between about 4 nm and about 2000 nm.

The proton-conducting electrolyte 104 (e.g., $GdO_x$) provides fast proton transport to and from the hydrogen loading layer 102. The electrolyte should preferably have a few characteristics: (1) a low electronic conductivity with a small number of activated electrons at room temperature to allow the electrolyte to sustain an electric field and (2) fast proton conduction. The proton-conducting electrolyte 104 may have a thickness of about 4 nm to about 10 μm. The thickness of the proton-conducting electrolyte 104 may be tailored for different applications. For example, the proton-conducting electrolyte 104 may have a thickness of about 4 nm to about 100 nm. As another example, the proton conducting electrolyte 104 may have a thickness of about 100 nm to about 1 μm. As another example, the proton conducting electrolyte 104 may have a thickness of about 1 μm to about 10 μm.

In one embodiment, a protective layer may be disposed between the hydrogen loading layer 102 and the proton-conducting electrolyte 104. The protective layer is permeable to protons so that protons can be conducted between the hydrogen loading layer 102 and the proton-conducting electrolyte 104. The protective layer may prevent or reduce oxidation of the hydrogen loading layer 102 and/or the bottom electrode 106. Example materials of the protective layer are palladium (Pd), platinum (Pt), and gold (Au). The protective layer may have a thickness of about 3 nm to about 100 nm. Preferably, the protective layer has a thickness of about 5 nm to about 10 nm.

In one embodiment, the cell does not include both a proton-conducting electrolyte 104 and a hydrogen loading layer 102. Instead, the cell includes a single layer that acts as both the hydrogen loading layer 102 and the proton-conducting electrolyte 104. The single layer may be any material that has a low electronic conductivity to support an electric field and fast proton conduction. In addition, the single layer allows the insertion of hydrogen or hydrogen ions. The insertion of hydrogen or hydrogen ions (e.g., protons) into the single layer changes an optical property of the material, such that the changed optical property regulates the transmission and/or reflection of a wavelength of light or a range of wavelengths. For example, the single layer may be $GdO_x$.

The top electrode 108 acts as catalyst to speed up the intake of protons from a water reservoir. The top electrode 108 may be in direct contact with a water reservoir (e.g., moisture in air under ambient or controlled humidity conditions, or a water storage layer). The top electrode acts as a catalyst for a water-splitting reaction with water from the reservoir to generate hydrogen ions. The top electrode 108 facilitates water, hydrogen and/or hydrogen ion transport between a water reservoir and the proton-conducting electrolyte 104. In one embodiment, to facilitate this transport, the top electrode 108 is porous. Because of its porosity, the top electrode 108 is electrically coupled with at least some of the water and/or a water-containing material (e.g., water storage layer), and at least some of the water and/or water-containing material is coupled with the proton conducting layer to facilitate hydrogen, and/or hydrogen ion transport.

In another embodiment, to facilitate transport, the top electrode 108 is permeable to water, hydrogen, and/or hydrogen ions so that these species may diffuse across the top electrode 108 to the proton-conducting electrolyte 104. The top electrode 108 may have a limited thickness to facilitate permeability. The top electrode may be formed from various noble metals including, but not limited to gold (Au), silver (Ag), platinum (Pt), palladium (Pd), rhodium (Rh), ruthenium (Ru), osmium (Os), and iridium (Ir), and their alloys.

The bottom electrode 106 provides the other electrical connection and can be made from various metal and non-metal electrical conductors including, but not limited to indium tin oxide (ITO), platinum (Pt), tantalum (Ta), titanium (Ti), vanadium (V), gold (Au), or tungsten (W).

The top and bottom electrodes are electrically continuous. The top and bottom electrodes may have one or more morphologies, including uniform layers, meshes, particles, and/or uniform layers with one or several holes. The top electrode and the bottom electrode may have little absorption (e.g., <80%, preferably <20%) at the wavelength or wavelengths of light whose optical response is regulated by the cell (also referred to herein as operational wavelength or wavelengths). The top and bottom electrodes may absorb less than 80% of the light at the operational wavelength or wavelengths. Preferable, the top and bottom electrodes absorb less than 20% of the light at the operational wavelength or wavelengths. The top and bottom electrodes may be only a few nanometers thick (e.g., about 2 nm to about 1 µm) so that they are transparent to the wavelength or wavelengths of light whose optical response is regulated by the cell. In one embodiment, the top electrode may be about 2 nm to about 100 nm and the bottom electrode may be about 2 nm to about 1 µm. In another embodiment, the top and bottom electrodes may each have a thickness of less than 100 nm. In another embodiment, the top and bottom electrodes may preferably each have a thickness of about 35 nm to about 85 nm. In another embodiment, the thickness of the electrodes may be less than about 20 nm.

In some cases, the bottom electrode 106 may be formed from multiple layers of materials, such as layers of platinum (Pt), palladium (Pd), magnesium (Mg), gold (Au), and indium-doped tin oxide (ITO), that are electrically coupled to one another. Each layer in the multiple layers may serve a particular function. For example, tantalum (Ta) and/or titanium (Ti) may promote adhesion to the substrate. Pd may protect the electrode from oxidation during fabrication or exposure to moisture. Other layers may help facilitate a specific optical response. One or more materials in the bottom electrode may have a hydrogen diffusivity lower than that of the hydrogen loading layer, such as Ta, Au, Pt, and/or tungsten (W). The bottom electrode may be connected to an electric ground.

A programmable mask including an array of cells may be used for many types of optical lithography, such as transmission lithography and reflective lithography. The light source used for lithography may provide light over a wavelength range of about 200 nm to about 2000 nm. Preferably, the light source may emit light over a wavelength range of about 200 nm to about 370 nm.

The programmable mask may have a very fine spatial resolution, e.g., on the order of a few nanometers. The spatial resolution may be about 5 nm to about 10 mm. The spatial resolution may be correlated with the dimensions of the cells in the programmable mask. The cells may be square or another shape. The cells in the array may be uniform or different sizes. The width of the cells may be defined by a lateral dimension of the cells and the amount of overlap of the top and bottom electrodes. Each cell in the programmable mask may have a width of about 4 nm to about 10 mm. In one embodiment, each cell preferably has a width of about 100 nm to about 50 µm. The width of the electrodes may range between about 4 nm and about 10 mm. The width of the electrodes may relate to the spatial resolution. The top electrode may overlap with the hydrogen loading layer by about 20% to about 100% of the area of the hydrogen loading layer. The bottom electrode may overlap with the hydrogen loading layer by any amount as long as the hydrogen loading layer is electrically coupled with the bottom electrode (e.g., about 0.1% to about 100%). The distance between neighboring electrodes may be as small as fabrication allows and as big as the size of the mask (e.g., about 1 nm to about 1 m). The distance between neighboring electrodes may be inhomogeneous. In one embodiment, the ratio of the distance between neighboring electrodes to the width of the electrodes may be less than 1:1 (e.g., as low as $1 \times 10^{-9}$:1). In another embodiment, the programmable mask may be paired with a static lithography mask and the distance between neighboring electrodes may be much larger (e.g., 1 nm to about 1 m). The programmable mask's fill factor (the area of the programmable mask actively used) may be about $1 \times 10^{-14}$% to about 95%. In one embodiment, the programmable mask's fill factor is preferably about 80%.

Further examples and details of the stack structure of the cell may be found in U.S. application Ser. No. 16/013,543, filed on Jun. 20, 2018, entitled, "Voltage-Controlled Optical Devices," which is incorporated herein by reference in its entirety.

The programmable mask may include a proton-conducting electrolyte that is divided into respective proton conducting regions corresponding to each cell. Similarly, the programmable mask may include a hydrogen loading layer that is divided into hydrogen loading regions, with one hydrogen loading region for each cell. The crosstalk between neighboring cells may be reduced in several ways. In one example, the portions of the hydrogen loading layer between neighboring cells may be absent, thus forming gaps that prevent the lateral diffusion of hydrogen between the cells. In one embodiment, the gaps are unfilled void spaces. In another embodiment, the gaps may be filled with one or more materials (e.g., $Al_2O_3$, $Cr_2O_3$, $Er_2O_3$, or $SiN_x$) with low hydrogen diffusivity and substantial transparency at the wavelengths of light regulated or modulated by the cells. In a third embodiment, the gaps are filled with one or more materials (e.g., Be, Ni, TiC, CrN, TiN, or TiAlN) with low hydrogen diffusivity and substantial absorption and/or reflection at the wavelengths of light whose optical response is regulated by the cells. This third embodiment may be used to reduce or eliminate the gaps in the transferred pattern, as discussed in further detail below.

When a gate voltage larger than the water splitting potential is applied to the top electrode, $H_2O$ (water) is split into $O_2$ and $H^+$ (protons) at the interface between the top electrode and the proton conducting electrolyte. The gate voltage applied to induce water splitting is also referred to as a loading voltage. Due to the electric field in the proton conducting layer, the protons are transported to the bottom hydrogen loading layer (also referred to herein as a hydrogen insertion layer) where they are reduced to hydrogen and inserted into the hydrogen loading layer. The insertion of hydrogen into the layer causes it to change from a metallic reflective state to a transparent dielectric state. This allows the layer to act like a light valve. Before applying a voltage to the cell, the layer prevents light from passing through and after applying a voltage, the layer transmits light. This change is reversible by applying a gate voltage of an opposite polarity (also referred to herein as an unloading voltage) where the inserted hydrogen is extracted from the layer. In this case, the transparent dielectric layer changes back to its initially metallic reflective state. The magnitudes of the loading and unloading voltages may be different. The programmable mask may also exhibit hysteresis since the response is not instantaneous.

The programmable mask may also undergo an initial priming step during the first cycle of operation. During this step, the loading/unloading voltages may have a higher magnitude than the voltages used in subsequent cycles to compensate for an initially slower rate of hydrogen insertion/extraction. After the first cycle, the magnitudes of the loading/unloading voltages used in subsequent cycles may be reduced and kept substantially constant.

Passive Addressing

Figure 2A:
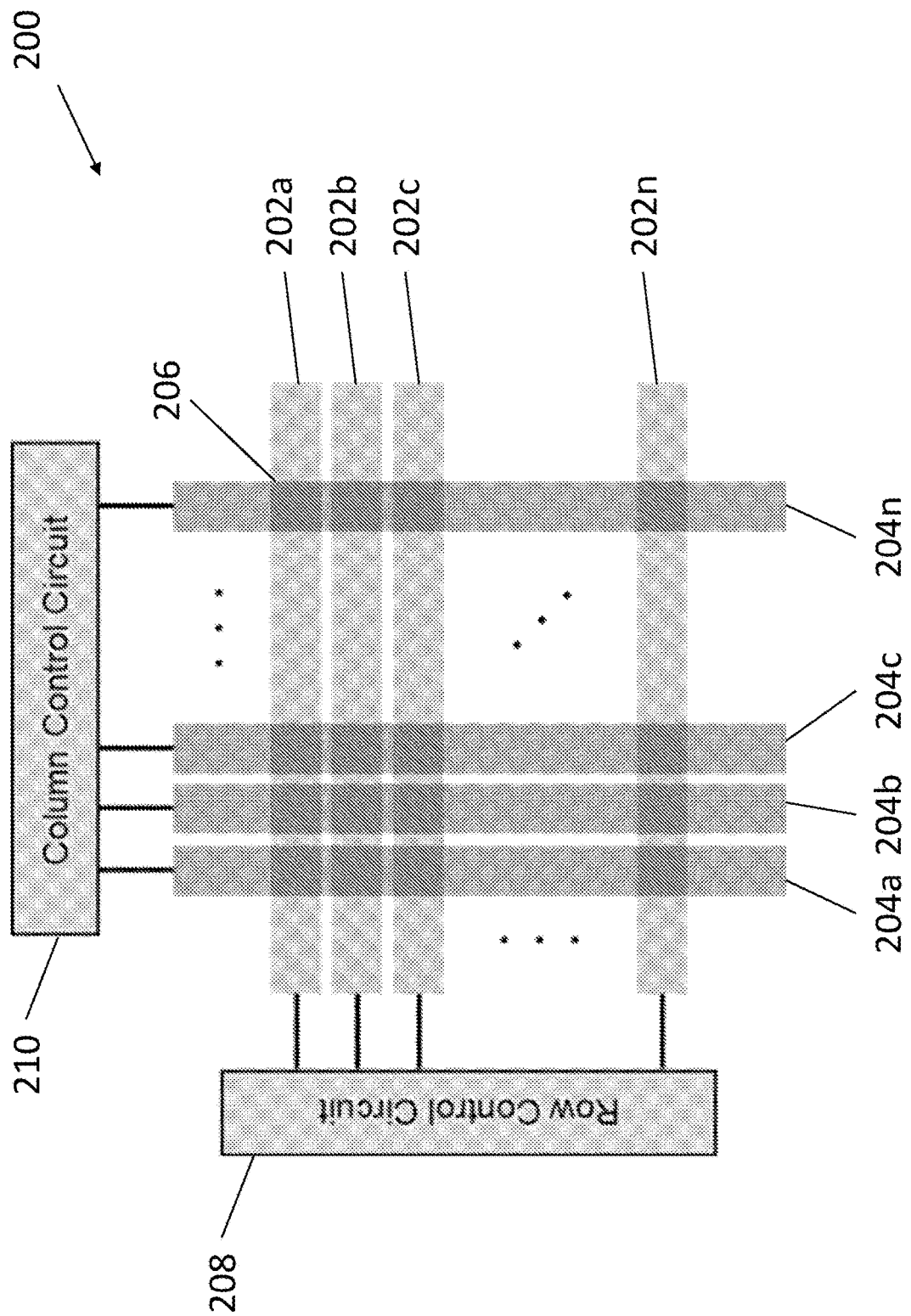
FIG. 2A shows an exemplary programmable mask using a crossbar array configuration.

FIG. 2A shows several of the cells described above arranged in a crossbar array configuration in a programmable mask 200. Each cell in the programmable mask 200 includes a hydrogen loading layer, a proton-conducting electrolyte, and bottom and top electrode layers sandwiching the hydrogen loading layer and the proton-conducting electrolyte.

A plurality of top electrodes (204a-204n) may be vertical and a plurality of bottom electrodes (202a-202n) may be horizontal (or vice versa). The spacing between the rows and columns may be about 1 nm to about 1 m. A programmable mask cell/pixel 206 is characterized either by the area of overlap between a top electrode and a bottom electrode or by the patterning of a hydrogen loading layer. This arrangement may generate lithography patterns with the resolution of the cell size. Passive addressing may be implemented to reduce the number of transistors used in the programmable lithography mask.

In FIG. 2A, the rows are the bottom electrodes 202a-202n (connected to the active layer) while the columns are the top electrodes 204a-204n. For passive addressing, there are four voltages that are applied to the crossbar array using the row control circuits 208 and the column control circuits 210: (1) V_row_ON, (2) V_row_IDLE, (3) V_column_ON, and (4) V_column_IDLE. Turning ON a cell means switching a cell from a reflective state to a transparent state. To select a cell to turn on, the row ON voltage is applied to the cell row while the column ON voltage is applied to the cell column. If there are multiple cells on the same row that are turned ON, the column ON voltage may be applied to multiple columns. The row IDLE and column IDLE voltages may be applied to all other rows and columns (these cells are set to IDLE).

The row ON and column ON voltages are selected so that their relative voltage difference across the cell is large enough to trigger the loading of hydrogen into the active layers. For instance, in FIG. 3A, the row ON voltage is 0 V while the column ON voltage is +4 V (the voltage difference is +4 V). The row and column IDLE voltages are selected so that (1) their voltage difference, (2) the voltage difference between row IDLE and column ON, and (3) the voltage difference between column IDLE and row ON can substantially hold the loaded hydrogen in the active layer without triggering additional insertion of hydrogen in the active layer.

Figure 2B:
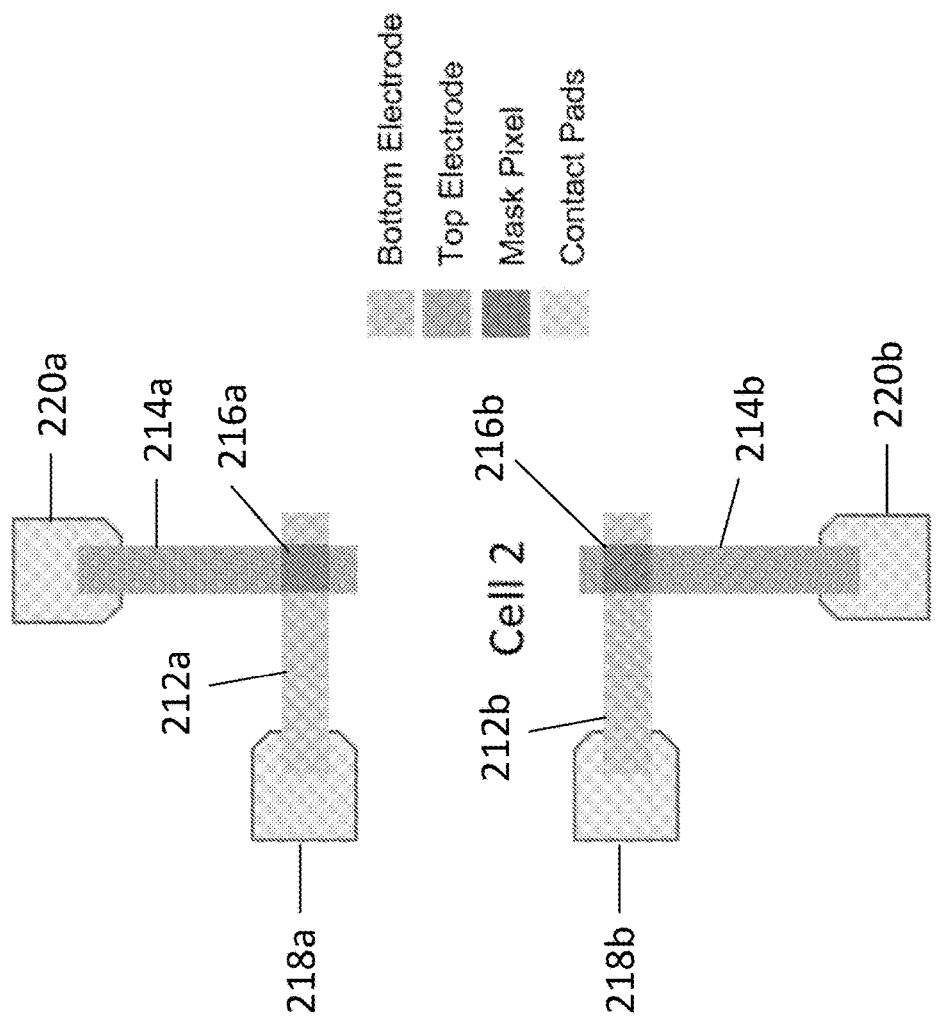
FIG. 2B shows an exemplary schematic of isolated programmable cells.

FIG. 2B shows an exemplary schematic of isolated programmable cells 216a and 216b. Isolated programmable cells 216a and 216b may be fabricated instead of or in addition to fabricating an entire programmable mask with a crossbar array of cells as in FIG. 2A. The isolated programmable cells 216a and 216b have bottom electrodes 212a and 212b, top electrodes 214a and 214b, bottom electrode contact pads 218a and 218b, and top electrode contact pads 220a and 220b, respectively. Control circuitry may be electrically coupled with contact pads 218a and 220a to control cell 216a; and with contact pads 218b and 220b to control cell 216b.

Isolated programmable cells may be used in a variety of applications. For example, isolated cells may be used to add programmable cells to a static mask pattern. In this case, isolated cells can be used to add programmability to certain local regions. This approach may be more convenient than fabricating an entire array of cells. The isolated cells may also be used in applications where it is desirable to directly control individual cells.

Figure 2C:
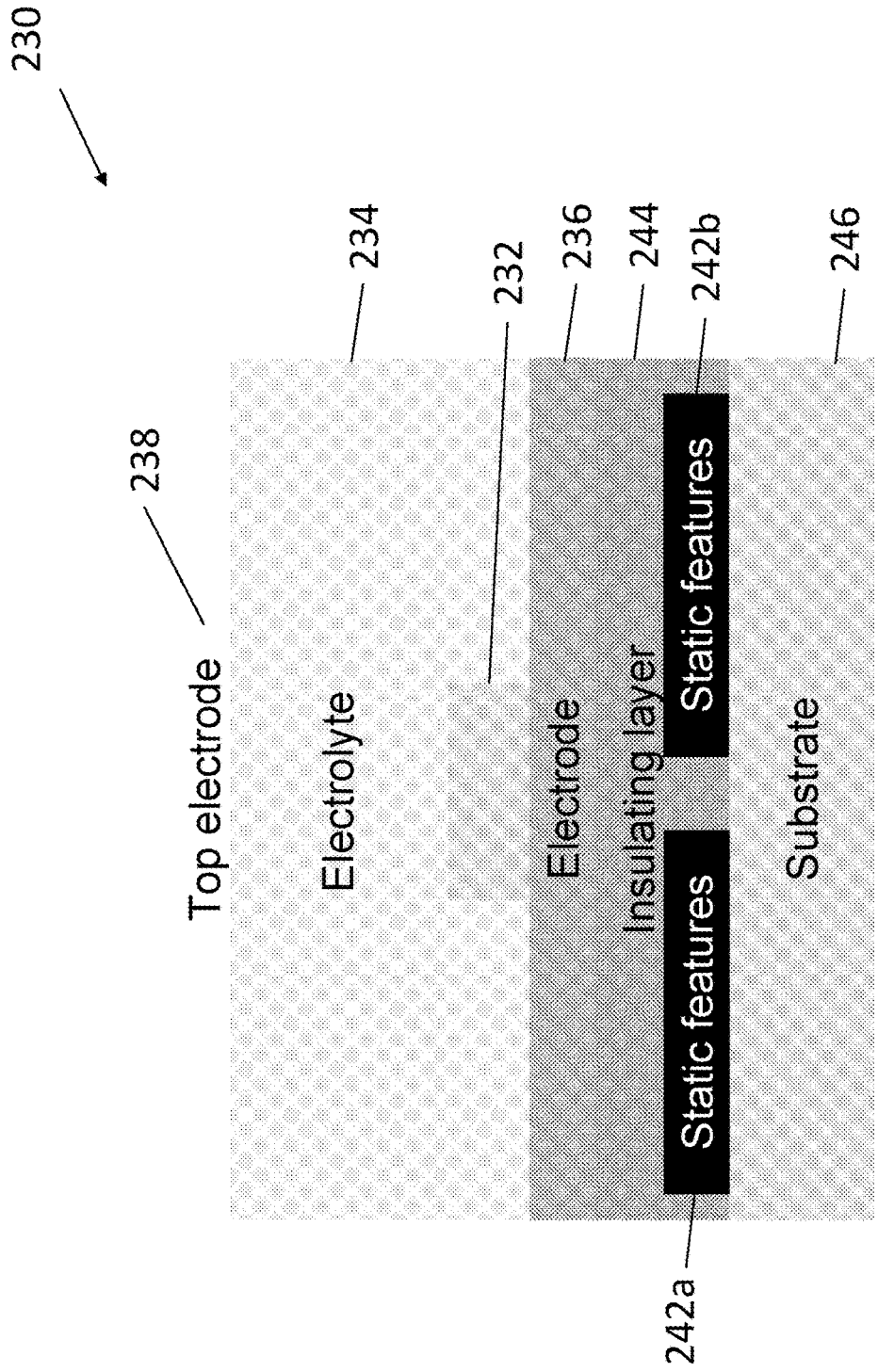
FIG. 2C shows an exemplary cross-section of a photolithographic mask with programmable features and static features.

FIG. 2C shows a cross-sectional schematic of combination device 230 with a static photolithography mask and an individual programmable cell. A combination device may be made with any number of programmable cells, individually or arranged in a cross-bar array. This device may be used to selectively program a particular area of a mask. Combination device 230 includes a hydrogen loading region 232, a proton-conducting electrolyte 234, and bottom 236 and top 238 electrodes sandwiching the hydrogen loading region 232. The combination device 230 may also include an insulating layer 244 between the static mask and the programmable cell so that the row and column electrodes are not electrically connected by conductive materials in the static mask. The insulating layer 244 may be any electrically insulating material, such as $Al_2O_3$ or $SiO_2$. The insulating layer 244 may smooth out any steep sidewalls present in the static mask, thereby providing a smoother surface for the electrodes of the programmable mask. The static mask includes static features 242a and 242b on a substrate 246. Other combination devices like the device 230 in FIG. 2C may be fabricated with different numbers of static features and programmable cells. In another embodiment of the combination device, the static mask is either made with insulating materials or configured so that conductive features of the static mask do not electrically couple with electrodes of the programmable cells such that an insulating material may not be disposed between the static mask and the programmable cells. The static mask may act as the substrate upon which the programmable cells are disposed.

Figure 3A:
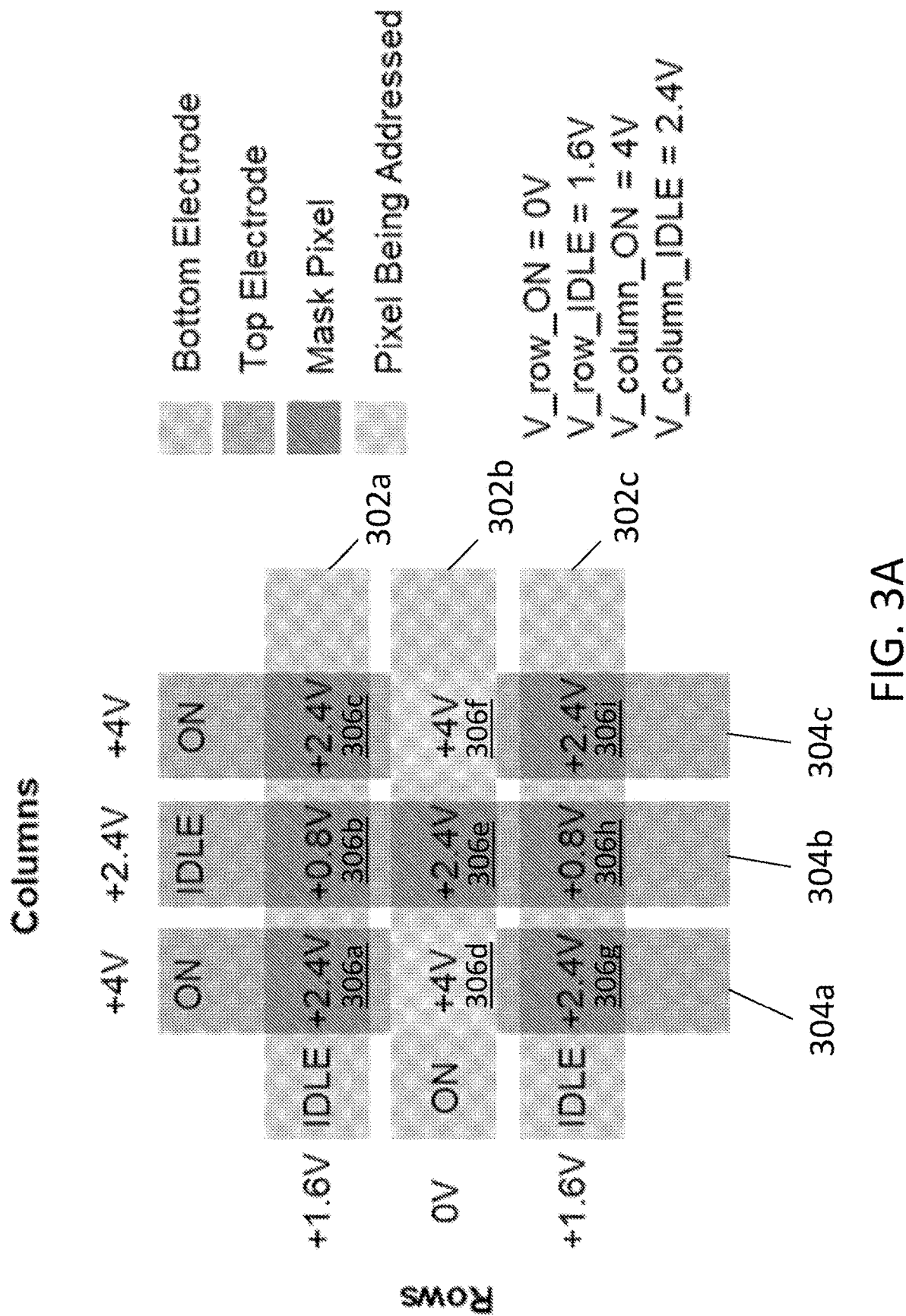
FIG. 3A shows an exemplary passive addressing voltage scheme applied to the programmable mask.

FIG. 3A shows an exemplary passive addressing voltage scheme applied to the programmable mask. In FIG. 3A, the row IDLE voltage is +1.6 V while the column IDLE voltage is +2.4 V. In FIG. 3A, row 302a is set to IDLE (+1.6 V), row 302b is set to ON (0 V), and row 302c is set to IDLE (+1.6 V). Column 304a is set to ON (+4 V), column 304b is set to IDLE (+2.4 V), and column 304c is set to ON (+4 V). As a result, cells 306a-306c, 306e, and 306g-306i are at voltages below the threshold voltage and are therefore set to OFF; and cells 306d and 306f are at or above the threshold voltage and are therefore set to ON.

To program a pattern into the whole programmable mask, the rows are addressed one at a time. This means V_row_ON may be applied to a selected row while keeping the voltage applied to the other rows at V_row_IDLE, and V_column_ON may be applied to the columns according to the desired pattern on the selected row, while keeping the voltage applied to the other columns at V_column_IDLE. The amount of time for which the voltage is applied to a row to program the row (also referred to here as dwell time) may be about 50 μs to about 15 s. After the addressing of all rows, the full pattern is generated, and the programmable mask may be used for lithography.

The cells in the programmable mask are semi-bistable. Once programmed, the cells do not need an applied voltage to remain in the programmed state. When a cell is programmed in the ON state, the cell may remain in the ON state for a period of time (e.g., 10 days). The period of time may depend on the rate of hydrogen leakage out of hydrogen loading layer due to a leakage electronic current across the proton-conducting electrolyte. To account for the semi-bistability of the programmable mask, a refresh programming sequence may be periodically run to apply voltages to the cells of the programmable mask in order to maintain the cells in their desired states for a longer period of time.

Figure 3B:
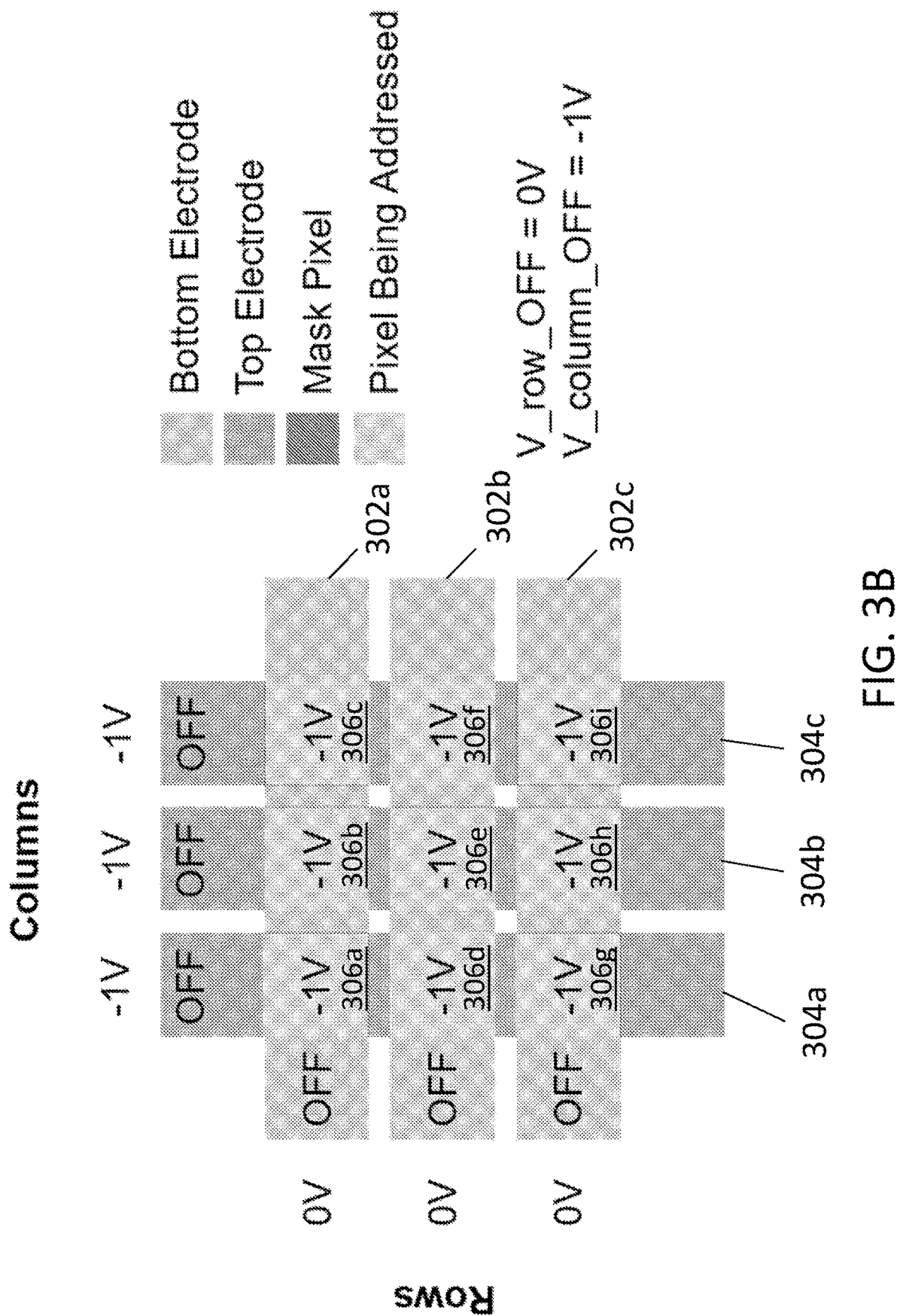
FIG. 3B shows an exemplary resetting voltage scheme applied to the programmable mask.

FIG. 3B shows an exemplary resetting voltage (also referred to here as unloading voltage) scheme applied to the programmable mask. To reset the mask pattern to a state where the cells are reflective, a row resetting voltage may be applied to rows 302a-302c while a negative voltage relative to the row voltage (e.g., −1 V) is applied to columns 304a-304c to unload the hydrogen from the active layers in cells 306a-306i to set them to OFF. The magnitude of the negative voltage determines the rate of unloading and therefore the resetting voltage dwell time. In one embodiment, the resetting dwell time may be about 240 seconds. A resetting voltage may also be selectively applied to each row or column to turn off the cells in the row and column, respectively. A resetting voltage may also be selectively applied to a single cell.

The loading voltage (ON voltage), idle voltage, and resetting voltage may each be relative voltages defined between the electrodes for each cell. For example, a loading voltage applied to one cell may entail applying 4 V to the top electrode and 0 V to the bottom electrode, so the voltage applied across the cell is +4 V. In general, the loading voltage may be greater than about 2.5 V, the idle voltage may be between about 0 V and about 2.5 V, and the resetting voltage may be less than about 0 V.

The speed of pattern generation is hence determined by the total number of rows. A pulsing scheme (described below) can be used to accelerate programming. The number of rows can be broken down into small segments so that the different segments can be addressed in a parallel fashion. In other cases, the pattern may be stitched together through repeated programming. The role of rows and columns can be interchanged if preferred.

Voltage Pulsing to Accelerate Hydrogen Loading

For programming the programmable mask, the voltage dwell time can be long enough such that the optical property of each cell is set at a desired level. Alternatively, a voltage pulse can be applied with a shorter dwell time, and a similar or higher voltage amplitude, to increase the programming speed. Pulsing allows sufficient time for the hydrogen to diffuse and equilibrate, enabling operation at a larger magnitude voltage. For this approach, the voltage pulses may be applied to the cells of each row or column in a sequential manner. For example, when one row is selected and designated as an active row, a voltage pulse corresponding to V_row_ON is applied to the row electrode of the active row and voltage pulses corresponding to V_column_ON or V_column_IDLE are applied to each column electrode according to the desired pattern of the active row. The voltage pulses applied to the row electrode of the active row and the column electrodes may be applied simultaneously. Additionally, the ON voltages may be larger in magnitude than in the passive addressing scheme described above.

While the cells in the active row are addressed, voltage pulses corresponding to V_row_IDLE are also applied to the remaining, inactive rows.

After a V_row_ON voltage pulse is applied to the active row, another row is then selected and designated as the new active row while the previous active row is returned to an inactive state. The process of applying ON and/or IDLE voltages to row and column electrodes is then repeated for the newly selected active row. These processes continue for each row until a desired number of rows receive a voltage pulse (e.g., 100 rows) corresponding to the completion of one cycle. Once the first cycle is completed, another cycle may begin by repeating the same processes as the first cycle. Additional cycles may be applied until the cells in the programmable mask are sufficiently addressed (e.g., the change in one or more optical properties of the cells exceed a desired threshold).

In one example, with row ON set to 0 V, 1000 100-microsecond, +10 V pulses may be applied with a cycle time of 10 ms instead of applying a column ON voltage of +4 V for 10 seconds in the passive addressing scheme. In this case, the active time to turn on each row is only 100 ms (1000×100 s). Within a duration of 10 seconds, 100 rows are cycled instead of 1 row (10 ms/100 s) in the passive addressing scheme. The selection of the cycle time may affect cell stability. It is preferable to choose a cycle time sufficient to achieve diffusion and equilibration of hydrogen after the initial pulse. The magnitude of the voltage and duration of the pulse are selected such that it increases speed while avoiding breakdown of the cells.

The cycle time may also be adjusted to change the number of rows addressed per cycle. The voltage pulse may generally have a magnitude greater than about 8 V to about 50 V. The duration of the pulse may also be less than about 100 ns to about 100 ms. The ratio of the cycle time of the voltage pulse to the pulse on time may be at least about 2:1. In this way, the pulsing scheme may have a substantial speed advantage over individual cell addressing schemes.

When using the pulsing scheme, the rows may be addressed in blocks. In the previous example, a block of 100 rows may be addressed (e.g., the 100 rows are cycled through 1000 times such that 1000 pulses are applied to each row) before moving on to the next block of 100 rows.

The implementation of passive addressing and voltage pulsing may be accomplished using a control board, which may be attached to a side of the programmable mask. The electrical connections from the rows and columns may be connected to this control board. In the case that the programmable mask and the mask aligner are built as a single system, the control board can be situated with the other controls of the mask aligner.

Controlled Atmosphere in an Enclosure

Figure 4A:
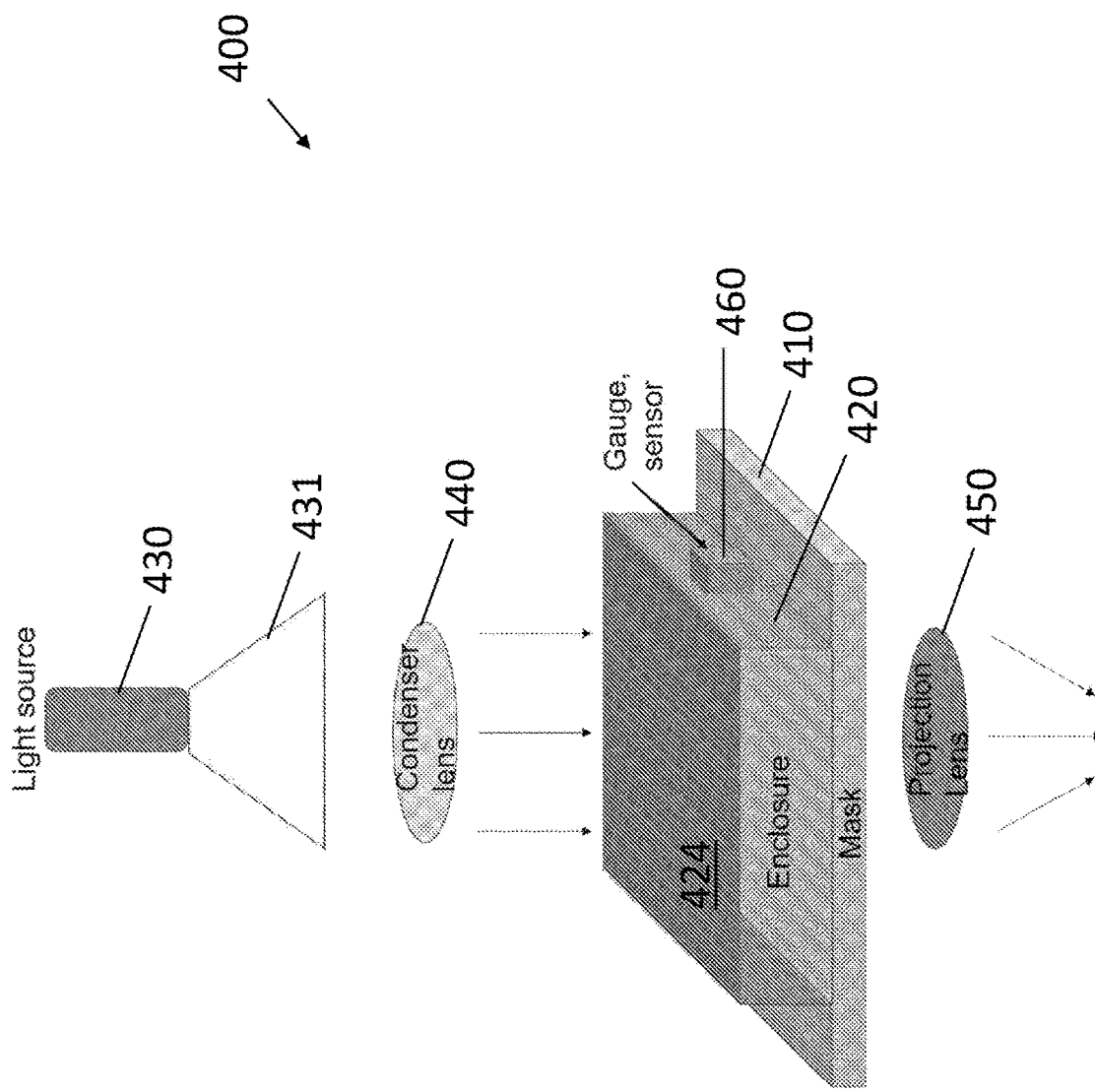
FIG. 4A shows a programmable mask deployed in a transmission lithography system with one side of the programmable mask disposed in an enclosure with a controlled atmosphere.
Figure 4B:
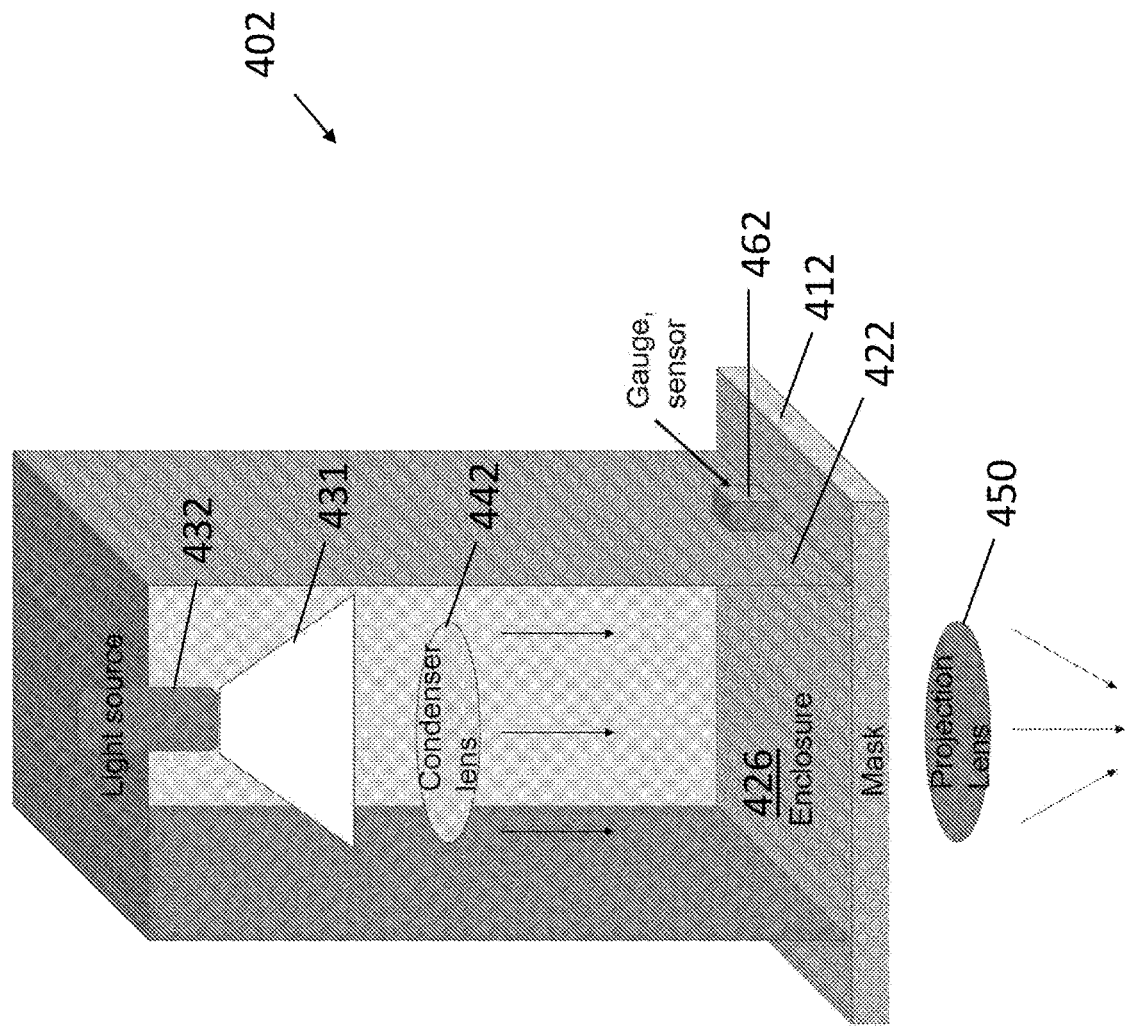
FIG. 4B shows a programmable mask deployed in another transmission lithography system with one side of the programmable mask and at least part of the light source disposed in enclosure with a controlled atmosphere.
Figure 4C:
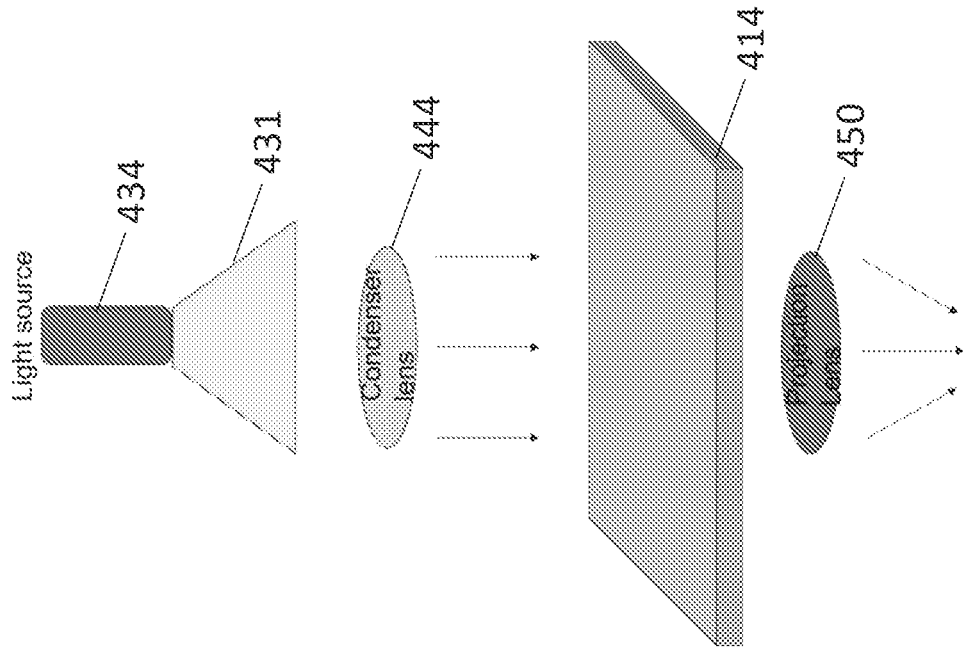
FIG. 4C shows another transmission lithography system where the programmable mask is programmed in an enclosure with a controlled atmosphere before the programmable mask is deployed as a lithography mask.
Figure 4C:
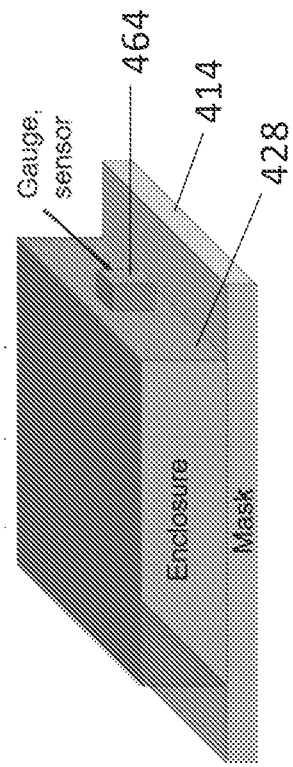

FIGS. 4A-4C show different transmission lithography systems using the programmable mask. The programmable mask may sit in an enclosure in which the atmosphere is precisely controlled (e.g., temperature and humidity levels). The water vapor surrounding the mask may act as a source of hydrogen for programming the programmable mask.

FIG. 4A shows a lithography system 400 with an enclosure 420 disposed on one side of the programmable mask 410. In this system, the enclosure does not enclose the light source 430. The light source 430 provides light 431 to pattern a photosensitive layer. The light 431 is directed towards the programmable mask 410 using a condenser lens 440. The light 431 is directed through the enclosure 420 without substantial attenuation such that the intensity of light reaching the photoresist through ON pixels in the programmable mask converts a section of the photoresist to a different state. At least the top side 424 and the bottom side (side opposite the top side) of the enclosure 420, through which the light 431 is directed, are made of a material (e.g., silica glass) substantially transparent to the light 431. The light 431 is directed towards the photosensitive layer using a projection lens 450.

The controlled atmosphere inside of the enclosure 420 may be controlled with one or more gauges and/or sensors 460. The gauges and/or sensors 460 may monitor the temperature and the humidity within the enclosure 420. The programmable mask may be operable at a temperature of about 10° C. and about 90° C. Preferable, the programmable mask is operable at a temperature of about 20° C. and about 35° C. Therefore, the enclosure 420 may be kept at a temperature of about 10° C. and about 90° C. The enclosure 420 may have a water vapor pressure of more than about 10 mTorr and less than about 22 Torr. The water vapor pressure and temperature in the enclosure 420 are controlled to reduce or prevent condensation from forming on the components in the enclosure 420. The water vapor pressure is tuned such that the light 431 is not substantially attenuated by interaction with the water vapor. Water vapor pressure may be added to the enclosure 420 by flowing an inert carrier gas (e.g., argon or nitrogen) with water vapor through the enclosure 420 using the gauges and sensors 460. Water vapor may be added to the inert carrier gas by bubbling the gas through a water reservoir or flowing the gas past the surface of a water reservoir.

FIG. 4B shows a lithography system 402 with an enclosure 422 disposed on one side of the programmable mask 412. In this system, the enclosure encloses at least a part of the light source 432 and the condenser lens 442. The light source 432 and the condenser lens 442 are configured to operate in the controlled atmosphere of the enclosure, which may be humid. The light source 432 and the condenser lens 442 may be configured to reduce or prevent water condensation on the surfaces of the light source 432 and the condenser lens 442. One or more surfaces of the light source 432 and the condenser lens 442 may have a hydrophobic coating to reduce condensation. The light source 432 may be enclosed within a water-resistant or watertight housing to prevent water vapor from reaching the inner electronics of the light source 432. At least the bottom side 426 of the enclosure 422, through which the light 431 is directed, is made of a material substantially transparent to one or more wavelengths of the light 431. The controlled atmosphere inside of the enclosure 422 may be controlled with one or more gauges and/or sensors 462.

FIG. 4C shows a two-step process for programming and using a programmable lithography mask 414. In step 1 (left), the programmable mask 414 is programmed while at least one side of the programmable mask 414 is enclosed by an enclosure 428. The enclosure 428 holds a precisely controlled atmosphere that may be controlled with gauges and/or sensors 464. In step 2 (right), the programmable mask 414, which was programmed in step 1, is removed from the enclosure 428 and is used for lithography with a light source 434 and condenser lens 444. In this embodiment, the optical properties programmed into the programmable mask 414 may persist outside of the enclosure for at least the duration of step 2. For example, the optical properties programmed into the programmable mask 414 may persist outside of the enclosure for a period of about 12 hours to days, weeks, months, or even years.

Integrated Water Storage Layer in Programmable Mask

Figure 5A:
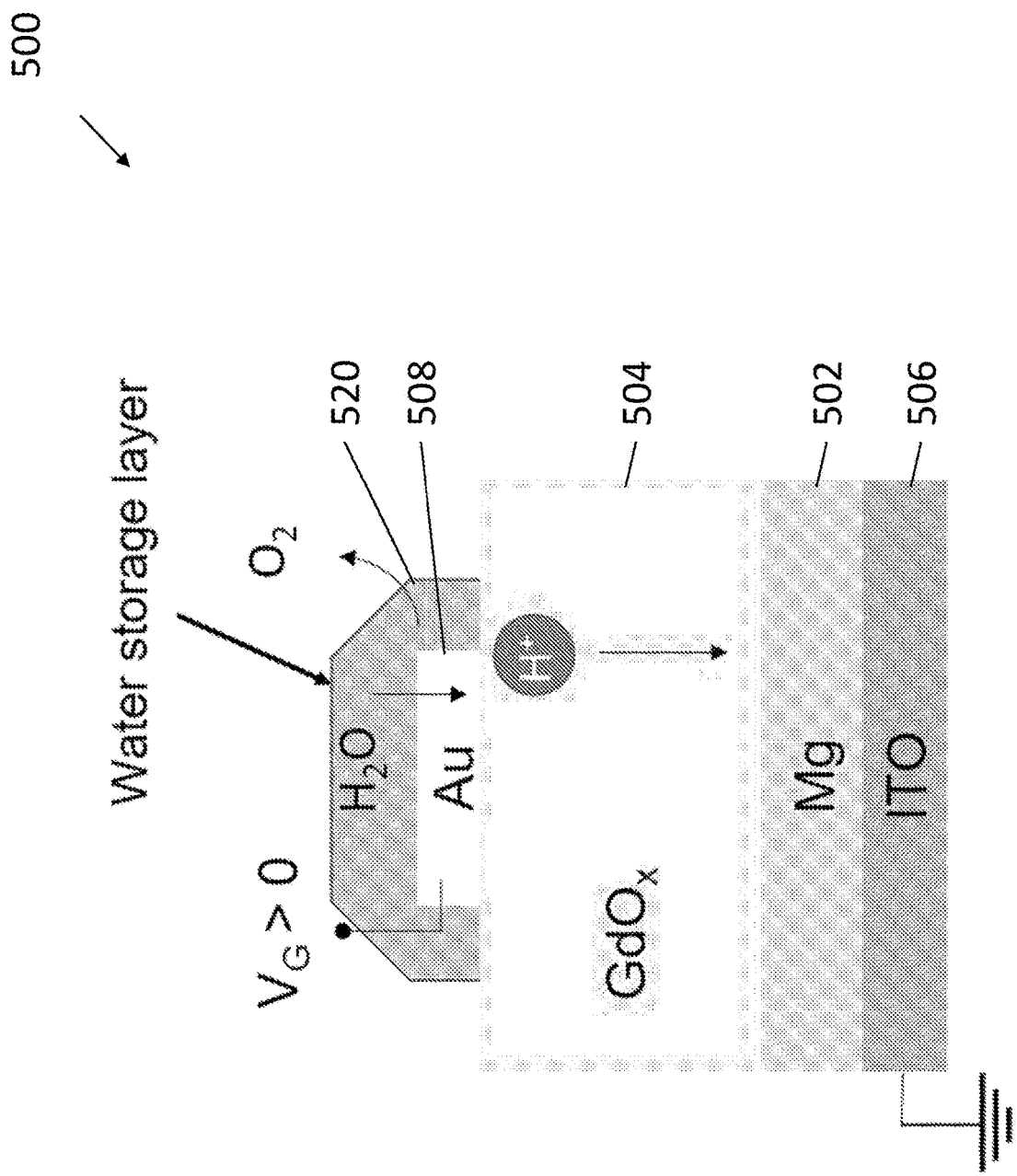
FIG. 5A shows a cross-sectional view of an exemplary stack structure of a cell in a programmable mask with an integrated water storage layer.
Figure 5B:
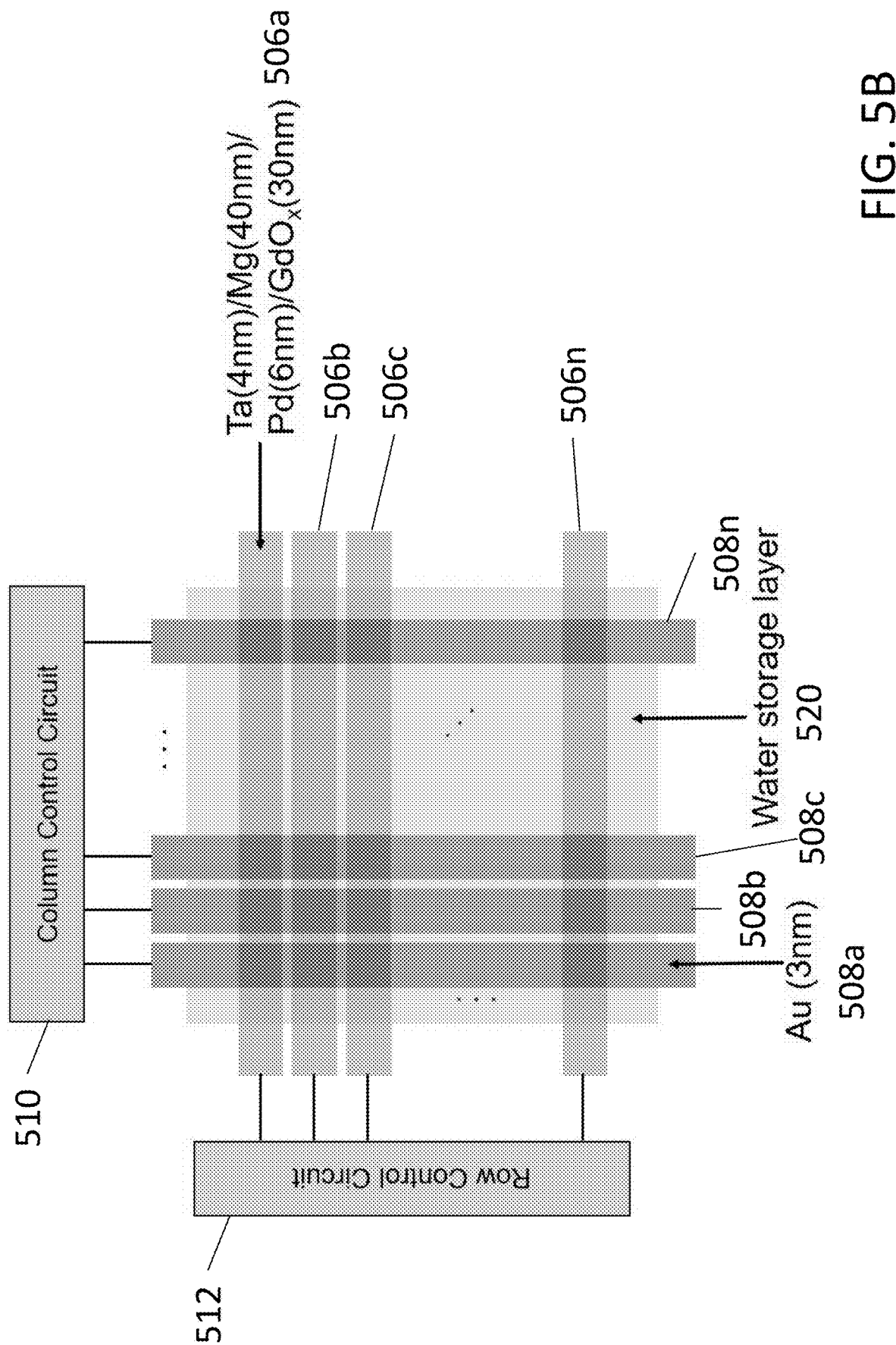
FIG. 5B shows an exemplary programmable mask with the integrated water storage layer of FIG. 5A.

One method to avoid dependence of the programmable mask on ambient moisture is to integrate a water storage layer on top of the existing device structure to act as a hydrogen source. FIGS. 5A and 5B show an example of this implementation. In FIG. 5A, the cells in the crossbar array may be fabricated with a stack structure 500 similar to that described above with regard to FIG. 1. The stack structure may include a hydrogen loading layer 502 (e.g., Mg), a proton-conducting electrolyte 504 (e.g., $GdO_x$), a bottom electrode 506 (e.g., ITO), and a top electrode 508 (e.g., Au). The stack may be deposited on a transparent substrate, such as $SiO_2$ glass. A water storage layer 520 may be deposited on top of the crossbar array, disposed on or near the top electrode 508, such that the top and bottom electrodes are still connected to the control circuits. The water storage layer 520 may store water in the form of water molecules, hydrate compounds, or hydroxide ions. If the water storage layer 520 stores water molecules, then an electrochemical reaction at the top electrode 508 forms protons and oxygen gas. Protons may diffuse evenly around the top electrode 508. If the water storage layer 520 stores water in the form of hydrate compounds or hydroxide ions, then an electrochemical reaction at the top electrode 508 forms protons and an oxidized form of the materials in the water storage layer. The water storage layer is substantially transparent to the wavelengths of light whose optical response is regulated by the mask. In one embodiment, the water storage layer 520 includes a capping layer deposited on top of the water storage layer to prevent or reduce dehydration of the water storage layer. The capping layer may be an oxide (e.g., alumina, silica, or titanium-doped silica glass) and may have a thickness of about 3 nm to about 10 mm. Examples of water storage layers include but are not limited to transparent hydrogels and oxide layers. Examples of transparent hydrogels include polyvinyl alcohol, polyethylene glycol, sodium polyacrylate, acrylate polymers, collagen, gelatin, alginate, and copolymers of any of these. Examples of oxides include $GdO_x$ and $YO_x$.

FIG. 5B shows a crossbar array with the water storage layer 520. In FIG. 5B, the rows are the bottom electrodes 506a-506n and the columns are the top electrodes 508a-508n. The crossbar array includes row control circuits 512 and the column control circuits 510. The water storage layer 520 may be deposited in a uniform layer on top of the top electrodes 508a-508n. The water storage layer 520 may be deposited using sputtering, evaporation, sol-gel methods, spin-coating, or other processing techniques. The water storage layer can also act as a protective layer to prevent mechanical damage to the devices when performing contact lithography (instead of projection lithography). In this case, the topside of the mask (where the device resides) may contact the wafer/substrate and an additional layer on top of the devices may prevent the devices from directly brushing against the wafer.

Reflective Lithography

Figure 6A:
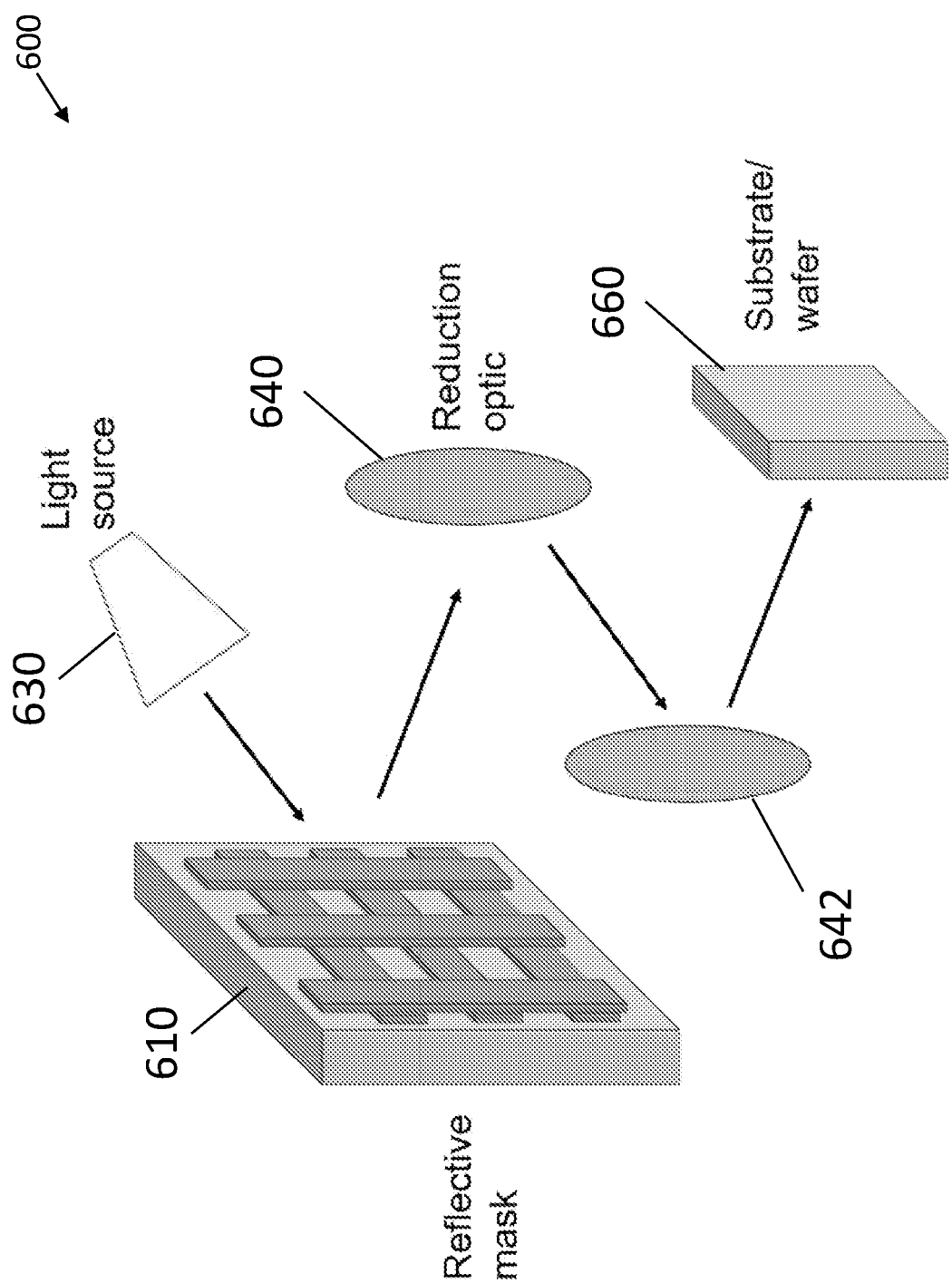
FIG. 6A shows an exemplary reflective programmable mask.

The utility of the programmable mask is not limited to transmission lithography. The programmable mask can be also used for reflective lithography (see FIGS. 6A and 6B). FIG. 6A shows a reflective lithography system 600 with a reflective programmable mask 610 (also called a "reflective mask") used for reflective lithography. Light from the light source 630 is directed towards the reflective mask 610 and reflected from the reflective mask 610. The light may interact with reduction optics 640 and 642 before being directed toward a substrate/wafer 660 with a photosensitive layer. The reflectivity of the reflective mask 610 in FIG. 6A may be modulated using one or more applied voltages to modulate the intensity of the light incident on the substrate/wafer 660.

Figure 6B:
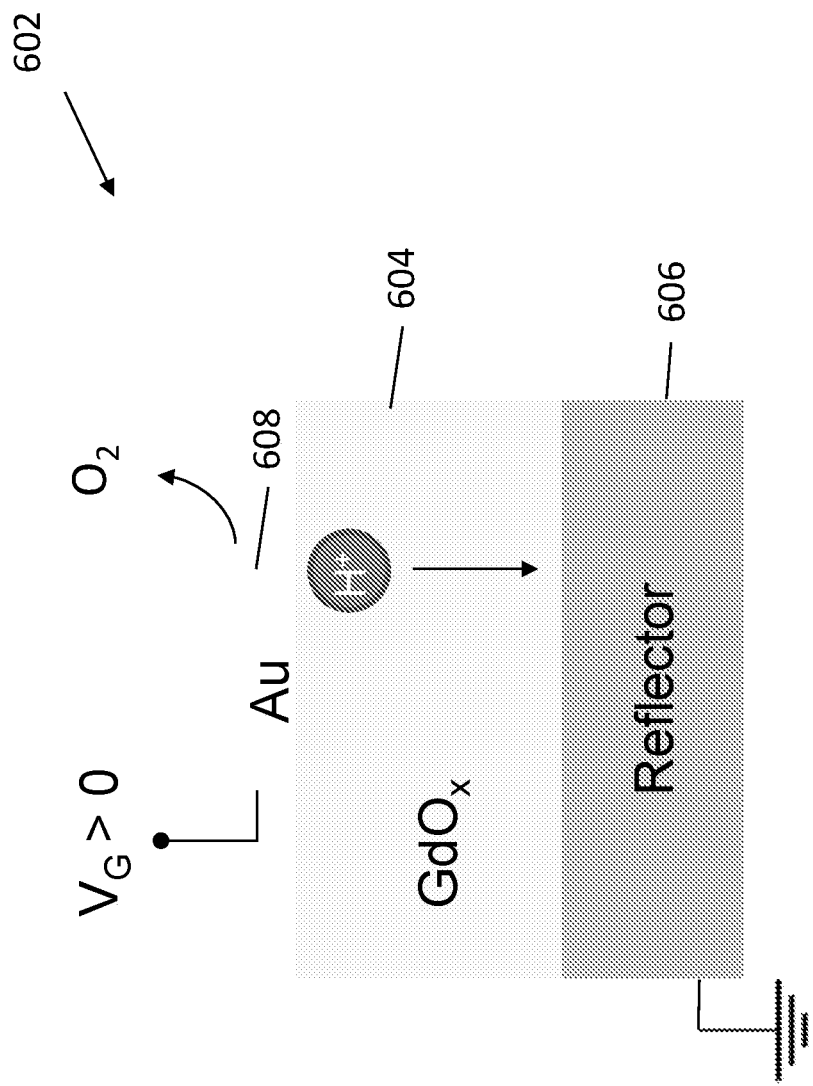
FIG. 6B shows a cross-sectional view of the reflective programmable mask of FIG. 6A.

FIG. 6B shows an exemplary stack structure 602 of a cell in the reflective mask 610 for reflective lithography. The stack structure 602 includes a top electrode (e.g., Au), a proton-conducting electrolyte 604 (e.g., $GdO_x$), and reflector 606 (e.g., a multilayer dielectric stack). The proton-conducting electrolyte 604 provides fast proton transport to and from the reflector 606. The reflector 606 may include a hydrogen loading layer and a bottom electrode. The reflector 606 may include any of the hydrogen loading layer materials described above with respect to FIG. 1. Each cell in the array of cells in the reflective programmable mask 610 may be individually addressable to program any pattern into the mask.

Example of a Programmable Mask Prototype

Figure 7:
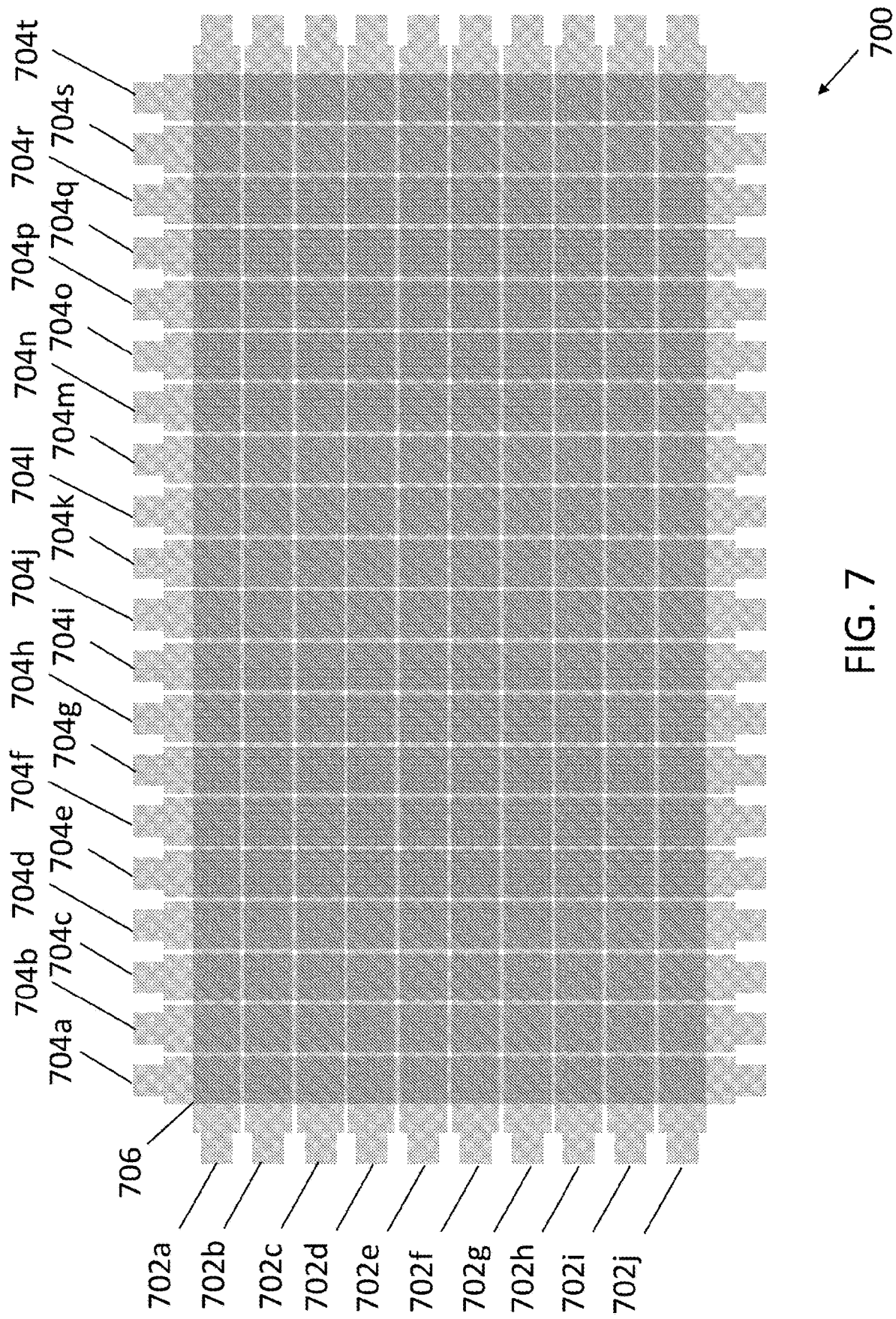
FIG. 7 shows an exemplary 10 pixel (cell)×20 pixel (cell) programmable mask.
Figure 8A:
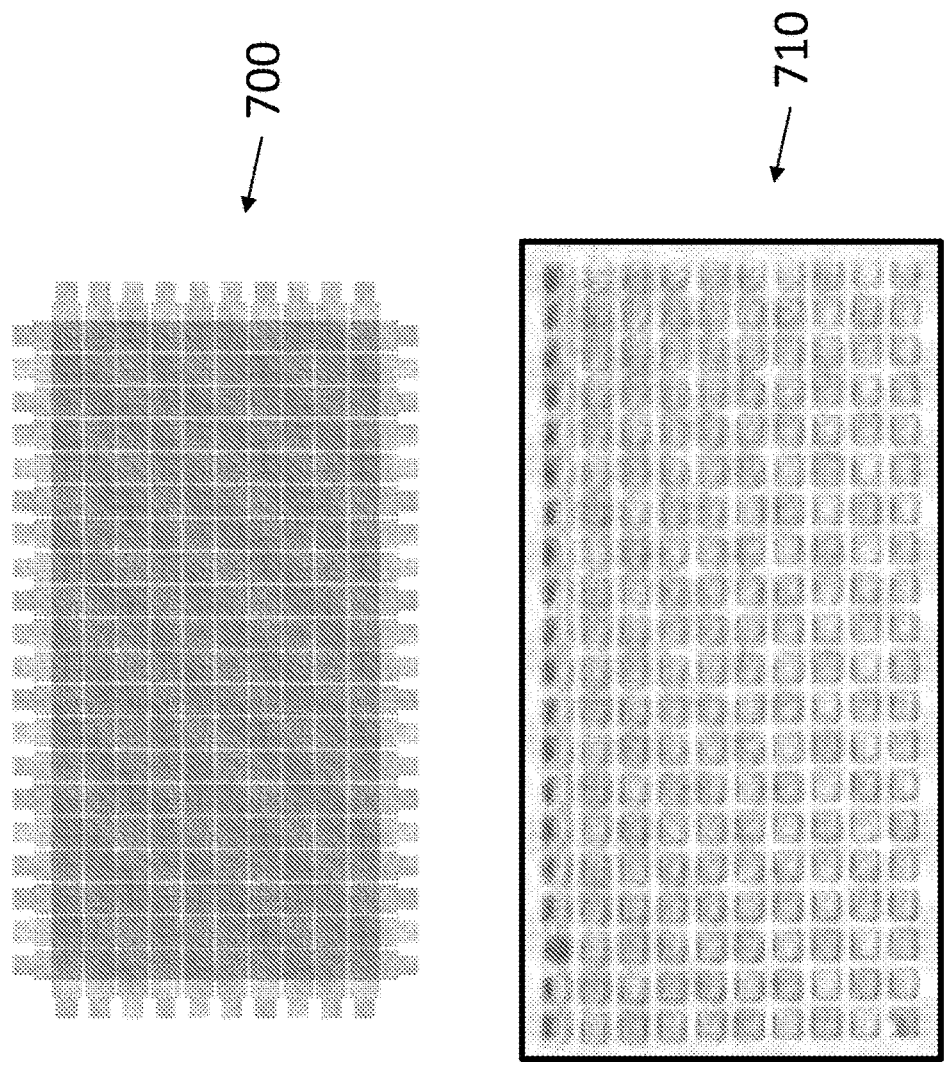
FIG. 8A shows a schematic of the 10 pixel×20 pixel programmable mask of FIG. 7 with respective pixels on and corresponding photoresist patterns obtained by the programmable mask.
Figure 8B:
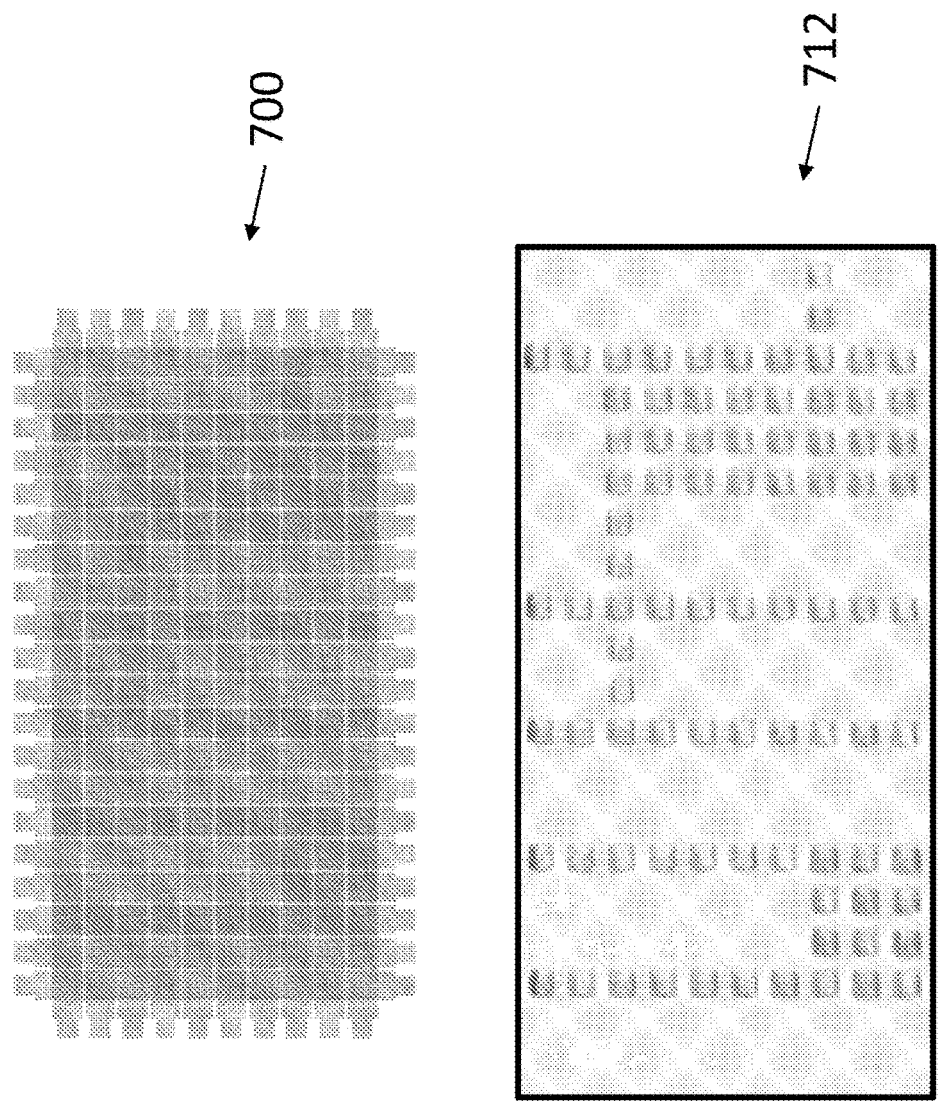
FIG. 8B shows a schematic of the 10 pixel×20 pixel programmable mask of FIG. 7 programmed with some pixels on and some pixels off and the corresponding photoresist patterns obtained by the programmable mask.

FIGS. 7-8B show a photolithography demonstration using a programmable mask. FIG. 7 shows a schematic of the programmable mask 700 with a plurality of cells 706 arranged in a 10×20 cell crossbar array. The cells 706 are about 50 μm wide squares with about 10 μm spacings between cells. Each row 702*a*-702*j* includes layers:

Ta (4 nm)/Au (3 nm)/Mg (40 nm)/Pd (6 nm)/$GdO_x$ (30 nm)/Au (3 nm).

Each column 704*a*-704*t* includes a layer of Au (3 nm) overlaid on the rows. The Au layers in the rows and columns are bottom and top electrodes, respectively. Mg is the active layer and $GdO_x$ is the proton-conducting electrolyte. The device is deposited on a silica-based glass.

FIGS. 8A and 8B show the results of the photolithography demonstration using the programmable mask 700. In FIG. 8A, a positive photoresist (MICROPOSIT S1813 Photoresist) was spin-coated onto a Si substrate. The coated substrate 710 was exposed to UV light through the programmable mask 700, where all the cells (pixels) of the programmable mask were turned off to block UV light. The parts of the photoresist exposed to UV light became soluble to the photoresist developer. After exposure to UV light, the coated substrate 710 was developed, resulting in the grid pattern of photoresist corresponding to the cells of the programmable mask 700.

In FIG. 8B, a photoresist-coated substrate 712 was exposed to UV light through the programmable mask 700, where some of the cells (pixels) of the programmable mask were turned on and some were turned off to program the mask 700 with the "MIT" logo. After exposure to UV light, the coated substrate 712 was developed, resulting in the pattern of photoresist corresponding to the pattern of on/off states of the pixels of the programmable mask 700.

Strategies to Generate Mask Pattern without Grid Gaps

The grid pattern shown in FIG. 8A arising from the inter-row and inter-column spacing in the programmable mask may be reduced or eliminated in several ways. The approach chosen may depend on several factors, such as how collimated the incident light is, exposure time, and development time.

Figure 9:
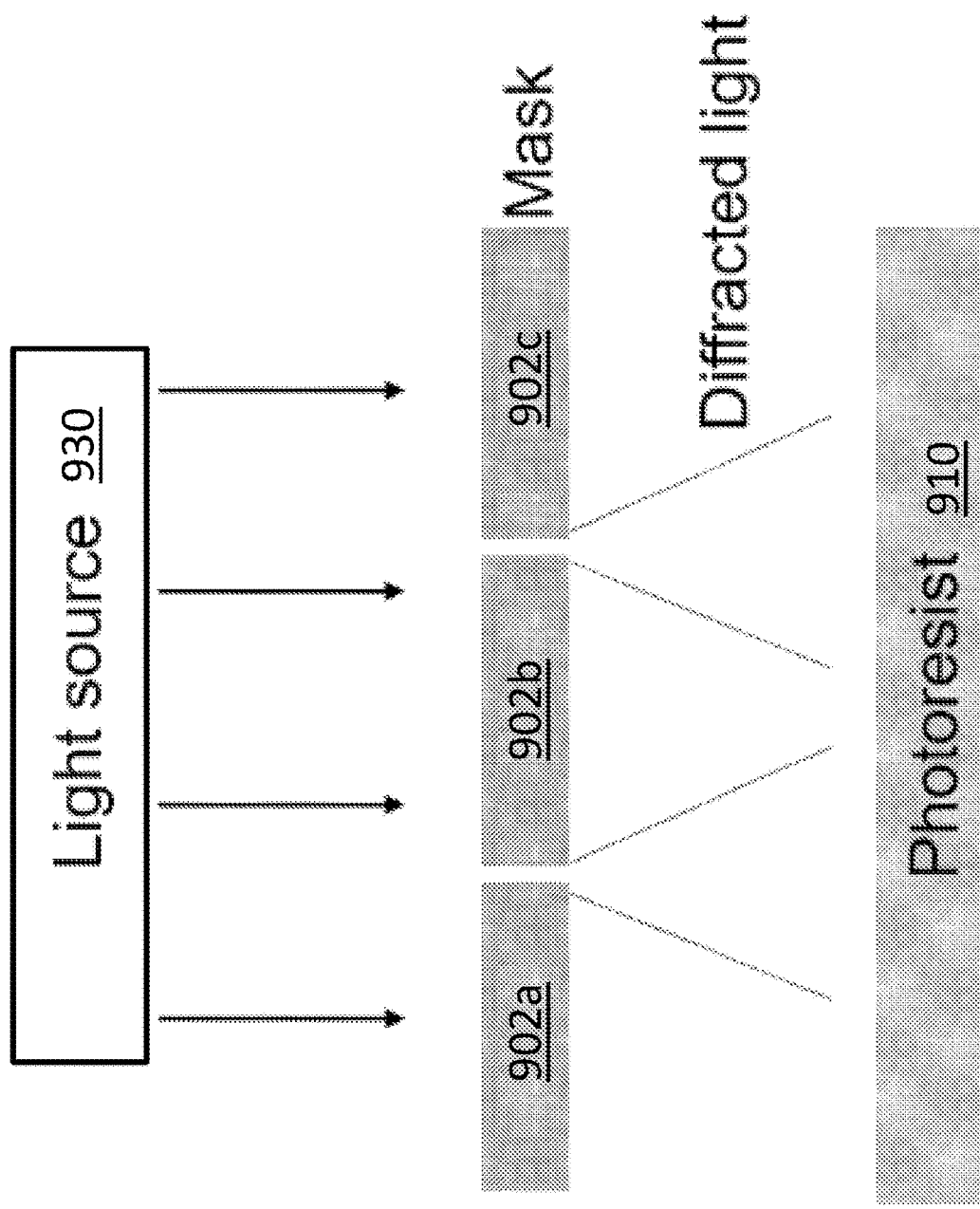
FIG. 9 shows a programmable lithography mask with little to no gap between neighboring rows and neighboring columns.

One approach is to make the spacing between the rows and columns of the programmable mask small relative to the width dimension of the rows and columns and the wavelength of the light used for lithography. The spacing is smaller than the resolution of the optical system so that the light leakage through the spacings does not substantially contribute to any area on the photoresist that receives the same level of light exposure as the ON pixels. The resolving power of the optical system depends on many factors including wavelength and numerical aperture. FIG. 9 shows a cross-sectional view of one set of rows 902*a*-902*c* (or columns). With the cells of the programmable mask turned off, the small gaps between the rows may transmit light through the programmable mask from the light source 930 at a higher local intensity than off pixels. When the size of the gaps is configured to be convolved with the point spread function which describes the three-dimensional diffraction pattern of light from an infinitely small point source on the mask, the intensity on the image plane of the photoresist 910 may be below the threshold to cause a reaction in the photoresist 910, thus preventing the formation of a grid pattern in the photoresist after development.

Figure 10A:
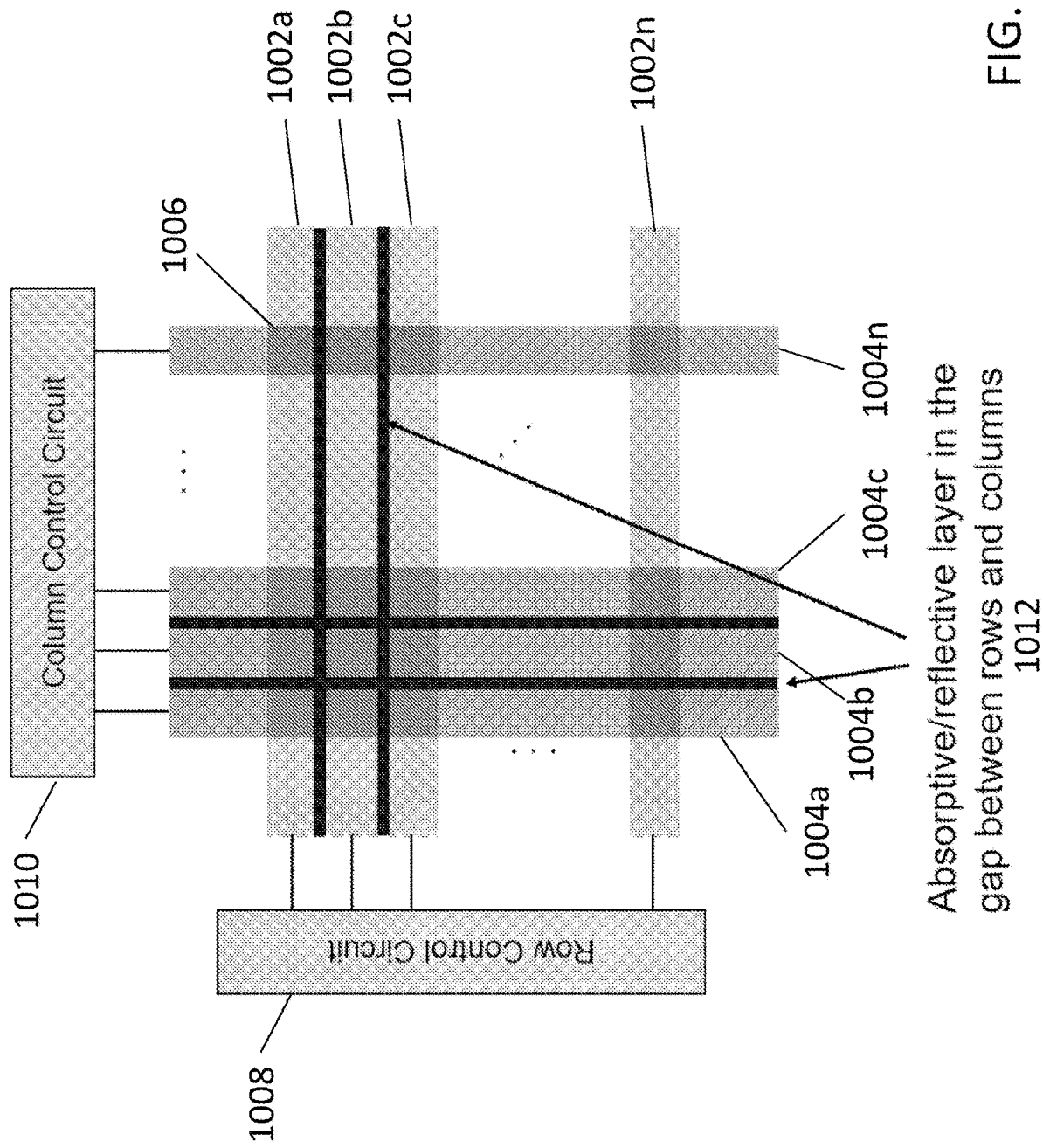
FIG. 10A shows a programmable lithography mask with absorptive/reflective layer/structure(s) between neighboring rows and neighboring columns.

Another approach is to place an absorptive/reflective layer or structure, such as a metal, in the spaces between neighboring rows and/or neighboring columns. FIG. 10A shows a programmable mask with a plurality of cells 1006 arranged in a crossbar array. With the cells of the programmable mask turned on, the small gaps between the rows may transmit light through the programmable mask from the light source 930 at a lower local intensity than the intensity of light transmitted through the on pixels. When the gaps are configured to be convolved with the point spread function which describes the three-dimensional diffraction pattern of light from an infinitely small point source on the mask, the intensity of the gaps on the image plane of the photoresist 910 may be below the threshold to cause a reaction in the photoresist 910, thus preventing the formation of a grid pattern in the photoresist after development. The programmable mask includes a plurality of bottom electrodes 1002*a*-1002*n* arranged in rows and a plurality of top electrodes 1004*a*-1004*n* arranged in columns. Cells 1006 are turned on or off using a voltage applied to the electrodes using row control circuit 1008 and column control circuit 1010. The absorptive/reflective layer 1012 may be disposed between the rows 1002*a*-1002*n* and/or columns 1004*a*-1004*n*. The absorptive/reflective layer 1012 may be any metal that reflects light at the operation wavelength without uncontrollably oxidizing (e.g., silver (Ag), platinum (Pt), or aluminum (Al)).

Figure 10B:
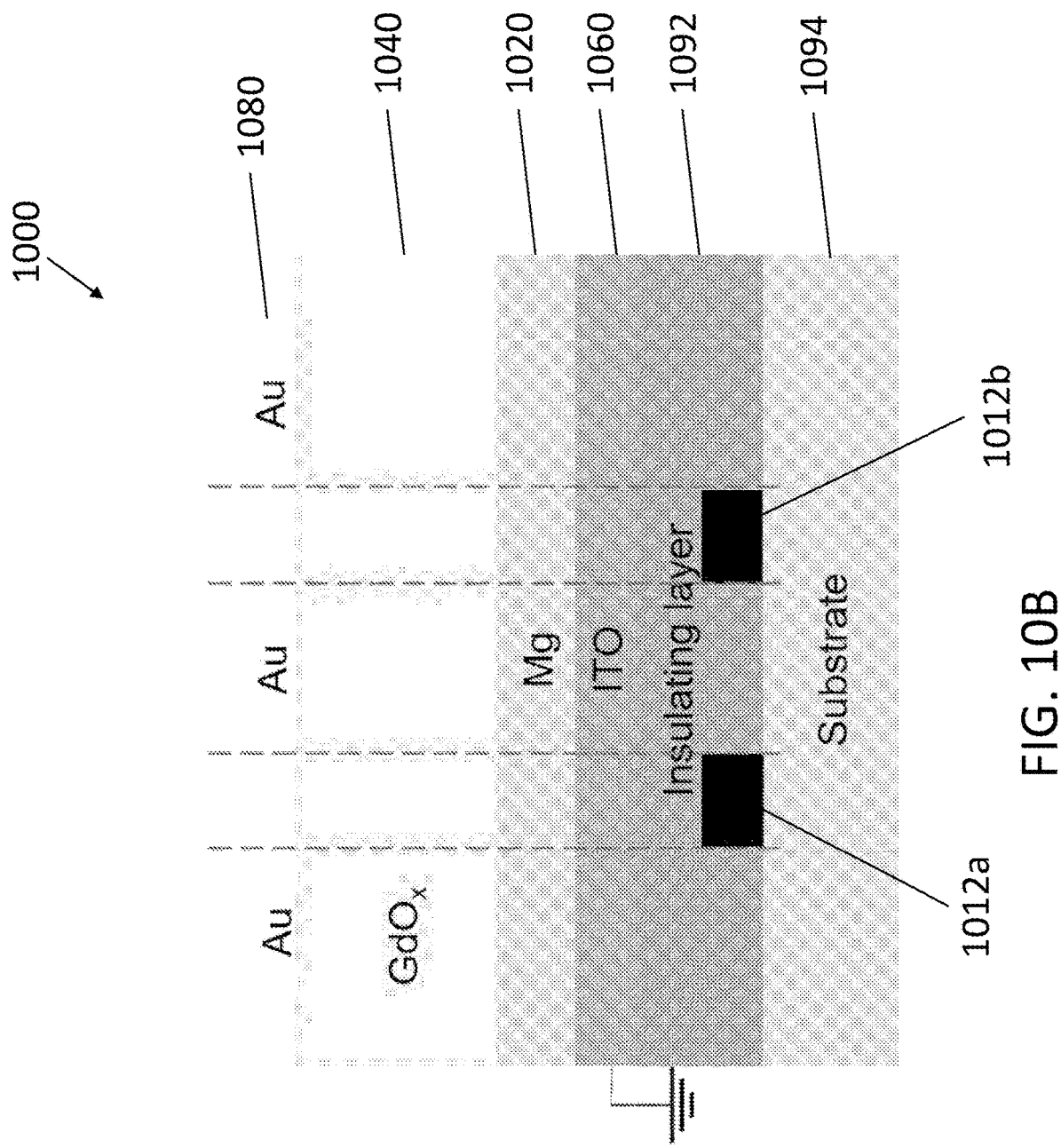
FIG. 10B shows a cross-sectional view of three cells in the programmable mask of FIG. 10A.

FIG. 10B shows the stack structure of a cell 1000 in the programmable mask. The cell includes a hydrogen loading layer 1020 (e.g., Mg), a proton-conducting electrolyte 1040 (e.g., $GdO_x$), a bottom electrode 1060 (e.g., indium-doped tin oxide (ITO)), a top electrode 1080 (e.g., Au). The absorptive/reflective layer 1012*a* and 1012*b* may be embedded in an insulating layer 1092 between the substrate 1094 and the bottom electrode 1060. The insulating layer 1092 may be a transparent oxide, such as magnesium oxide, alumina, or silica. The substrate may be a transparent material (e.g., $SiO_2$ glass). The absorptive/reflective layer 1012*a* and 1012*b* may be deposited using a thin film deposition technique, such as sputtering, evaporation, or chemical vapor deposition.

With the absorptive/reflective layer 1012, the programmable mask with all cells in the "off" state may prevent any substantial exposure of the photoresist to light during lithography. In other words, the programmable mask is opaque to the wavelengths of light used for lithography. When the cells of the programmable mask are in the "on" state, the lithography light may be sufficiently diffracted by the activated cells to expose the portions of the sample underneath the absorptive/reflective layer in the inter-row and inter-column spaces to light, thus avoiding the formation of any undesirable pattern from the absorptive/reflective layer/structure.

Figure 11A:
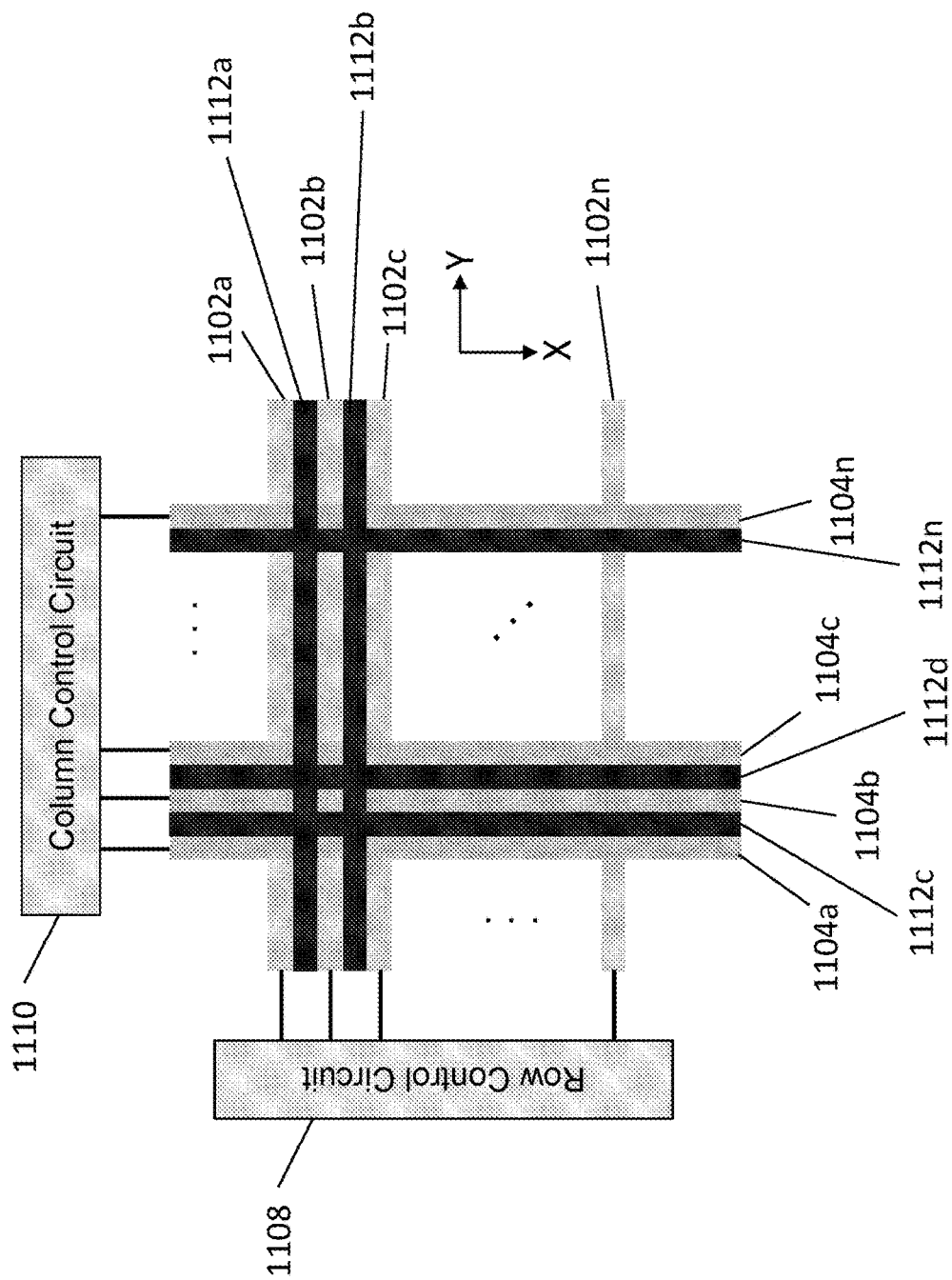
FIG. 11A shows a programmable lithography mask with several overlapping programmable layers.
Figure 11B:
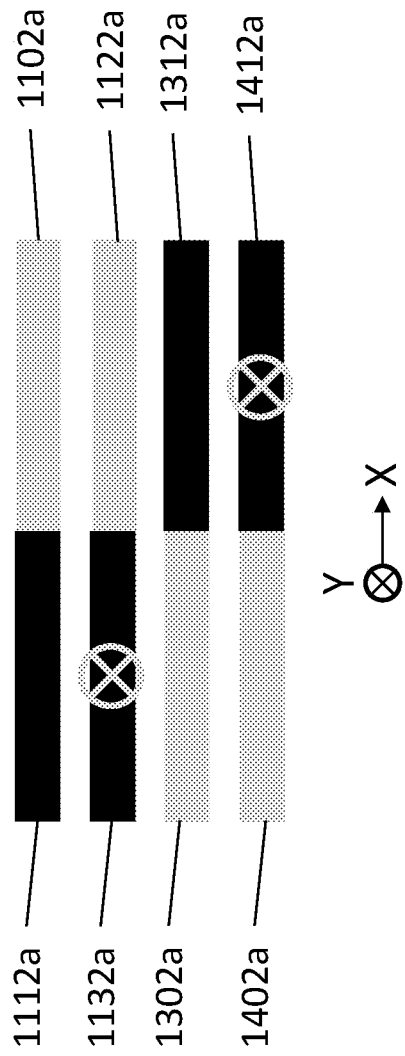
FIG. 11B shows an exemplary stacking structure of several programmable layers in the programmable mask in FIG. 11A.

Yet another approach is to use multiple programmable masks or multiple programmable layers for one desired pattern. FIGS. 11A and 11B show one example that includes a multilayer programmable mask with multiple programmable layers offset from each other along a x and y direction to cover up gaps between neighboring rows and neighboring columns of any one programmable layer. FIG. 11A shows a top view of a single programmable layer in the multilayer programmable mask. Each programmable layer may have a similar structure to the programmable mask of FIG. 10A with absorptive/reflective layers 1112a-1112n between the rows 1102a-1102n and columns 1104a-1104n of the programmable layer.

FIG. 11B shows an expanded cross-sectional schematic of a part of the four programmable layers in the multilayer programmable mask. The four programmable layers have a similar configuration. The first programmable layer acts as a reference point, the second programmable layer is offset by 1 unit along the y direction, the third programmable layer is offset by 1 unit along the x direction, and the fourth programmable layer is offset by 1 unit along both the x and y directions. In this manner, when the cells are turned off, light passing through the gaps of one mask/layer is blocked by another mask/layer. For this configuration, there may be larger gap spacing between the rows and columns. This gap spacing may be equal to or smaller than the dimensions of the row and column. This approach does not necessarily change the resolution of the programmable mask.

FIG. 11B shows the first programmable layer's first row 1102a and first reflective/absorptive layer 1112a; the second programmable layer's first row 1122a and first reflective/absorptive layer 1132a; the third programmable layer's first row 1302a and first reflective/absorptive layer 1312a; and the fourth programmable layer's first row 1402a and first reflective/absorptive layer 1412a. Each mask has a 50% fill ratio, defined as the ratio of row width to reflective layer width.

Making a Programmable Mask

Figure 12:
FIG. 12 shows an exemplary method of making a programmable mask.

FIG. 12 shows an exemplary method of preparing a programmable mask in a series of steps. FIG. 12 (left) shows a top-down simplified schematic of the programmable mask. FIG. 12 (right) shows a side view of the same programmable mask. In step 1, contact pads 1202a and 1202b are provided on a silica-based substrate. The contact pads 1202a and 1202b provide electrical coupling between the bottom electrode and the external circuitry. The contact pads may be any electrically conductive metal (e.g., Au). The contact pads may include an adhesion layer (e.g., Ta).

In step 2, a bottom electrode 1216 (e.g., Pt, ITO) is deposited. The bottom electrode 1216 may include an adhesion layer (e.g., Ta). In step 2, a patterned hydrogen loading layer (e.g., Mg) is deposited on top of the bottom electrode 1216. The hydrogen loading layer is patterned as regions 1212a and 1212b so that the hydrogen loading layer is not continuous between cells in the programmable mask. The hydrogen loading layer regions 1212a and 1212b and the bottom electrode 1216 are electrically coupled to the contact pads 1202a and 1202b.

In step 3, a proton-conducting electrolyte layer 1214 is deposited on top of the hydrogen loading layer regions 1212a and 1212b, as well as part of the bottom electrode 1216. The proton-conducting electrolyte layer 1214 covers all surface of each hydrogen loading layer region 1212a and 1212b to prevent an electrical short-circuit.

In step 4, the top electrodes 1218a and 1218b are deposited on the proton-conducting electrolyte layer 1214 in alignment with the hydrogen loading layer regions 1212a and 1212b, respectively. In another embodiment, the deposition sequence shown in FIG. 12 can be reversed for top-down processing. Each component of the programmable mask may be deposited using one or more deposition technique, including sputtering, evaporation, atomic layer deposition, chemical vapor deposition, and sol-gel methods.

Standalone Spatial Light Modulator

Because the programmable mask facilitates spatial modulation of a beam of light, the programmable mask can also be used as a standalone spatial light modulator. The standalone spatial light modulator facilitates wavefront forming and beam steering. The standalone spatial light modulator may have applications in projectors and holographic displays. The standalone spatial light modulator may provide smaller pixel pitch than existing spatial light modulators based on liquid crystals (~3 µm) and micromirrors (~5 µm). The small pixel pitch of the standalone spatial light modulator allows for higher resolution and higher diffraction angle for beam steering and hologram generation.

CONCLUSION

All parameters, dimensions, materials, and configurations described herein are meant to be exemplary and the actual parameters, dimensions, materials, and/or configurations will depend upon the specific application or applications for which the inventive teachings is/are used. It is to be understood that the foregoing embodiments are presented primarily by way of example and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein.

In addition, any combination of two or more such features, systems, articles, materials, kits, and/or methods, if such features, systems, articles, materials, kits, and/or methods are not mutually inconsistent, is included within the inventive scope of the present disclosure. Other substitutions, modifications, changes, and omissions may be made in the design, operating conditions and arrangement of respective elements of the exemplary implementations without departing from the scope of the present disclosure. The use of a numerical range does not preclude equivalents that fall outside the range that fulfill the same function, in the same way, to produce the same result.

Also, various inventive concepts may be embodied as one or more methods, of which at least one example has been provided. The acts performed as part of the method may in some instances be ordered in different ways. Accordingly, in some inventive implementations, respective acts of a given method may be performed in an order different than specifically illustrated, which may include performing some acts simultaneously (even if such acts are shown as sequential acts in illustrative embodiments).

All publications, patent applications, patents, and other references mentioned herein are incorporated by reference in their entirety.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or"

should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A reconfigurable mask comprising:
   a first electrode;
   a second electrode;
   a third electrode;
   a hydrogen loading layer, disposed between the first electrode and the second electrode and between the first electrode and the third electrode, comprising:
      a first hydrogen loading region, disposed between the first electrode and the second electrode, having a first transmission, absorption, phase shift, and/or reflectivity that varies with a first concentration of hydrogen ions in the first hydrogen loading region; and
      a second hydrogen loading region, disposed between the first electrode and the third electrode, having a second transmission, absorption, phase shift, and/or reflectivity that varies with a second concentration of hydrogen ions in the second hydrogen loading region;
   a proton-conducting electrolyte, disposed between the first electrode and the second electrode and between the first electrode and the third electrode, comprising:
      a first proton conducting region, disposed between the first electrode and the second electrode, defining a first interface in direct contact with the first electrode; and
      a second proton conducting region, disposed between the first electrode and the third electrode, defining a second interface in direct contact with the first electrode;
   a water storage layer, disposed on the first electrode, to store water, hydrate compounds, or hydroxide ions and to provide hydrogen ions to the hydrogen loading layer via electrochemical reactions of the water, hydrate compounds, or hydroxide ions at the first interface and the second interface; and
   a capping layer, deposited on top of the water storage layer, to prevent or reduce dehydration of the water storage layer,
   wherein the first electrode is porous or permeable to water, hydrogen, or hydrogen ions.

2. The reconfigurable mask of claim 1, wherein the water storage layer stores water and:
   the first interface is configured to split water into oxygen and hydrogen ions in response to a first voltage, applied across the first electrode and the second electrode, the first voltage generating a first electric field, at least some of the hydrogen ions propagating towards the first hydrogen loading region via at least one of the first electric field or diffusion, to change the first concentration of hydrogen ions in the first hydrogen loading region and the first transmission, absorption, phase shift, and/or reflectivity of the first hydrogen loading region; and
   the second interface is configured to split water into oxygen and hydrogen ions in response to a second voltage, applied across the first electrode and the third electrode, the second voltage generating a second electric field, at least some of the hydrogen ions propagating towards the second hydrogen loading region via at least one of the second electric field or diffusion, to change the second concentration of hydrogen ions in the second hydrogen loading region and the second transmission, absorption, phase shift, and/or reflectivity of the second hydrogen loading region.

3. The reconfigurable mask of claim 2, further comprising:
   a voltage source, in electrical communication with the first electrode, the second electrode, and the third electrode, to apply the first voltage and the second voltage, the first voltage equal to a sum of a first terminal voltage applied to the first electrode and a second terminal voltage applied to the second electrode, the second voltage equal to a sum of the first terminal voltage and a third terminal voltage applied to the third electrode.

4. The reconfigurable mask of claim 3, wherein the first voltage is one of a loading voltage to change the first transmission, absorption, phase shift, and/or reflectivity by splitting water at the first interface, an idle voltage to hold the first transmission, absorption, phase shift, and/or reflectivity constant by preventing a change in the first concentration of hydrogen ions, or an unloading voltage to change the first transmission, absorption, phase shift, and/or reflectivity by recombining the oxygen and the hydrogen ions into water at the first interface.

5. The reconfigurable mask of claim 4, wherein the loading voltage is greater than about 2.5 V, the idle voltage is between about 0 V and about 2.5 V, and the unloading voltage is less than about 0 V.

6. The reconfigurable mask of claim 4, wherein the first voltage is the loading voltage and the second voltage is the idle voltage to hold the second transmission, absorption, phase shift, and/or reflectivity constant by preventing a change in the second concentration of hydrogen ions in the second hydrogen loading region.

7. The reconfigurable mask of claim 1, wherein:
the first electrode is orthogonal to the second electrode; and
the second electrode is parallel to the third electrode.

8. The reconfigurable mask of claim 7, wherein the second electrode and the third electrode have identical widths and wherein the second electrode and the third electrode are separated by a distance less than about 100 nm such that a ratio of the distance to the width of the second electrode and the third electrode is less than 1:1.

9. The reconfigurable mask of claim 1, wherein the first electrode, the second electrode, and the third electrode each have a width ranging between about 10 nm and about 100 μm.

10. The reconfigurable mask of claim 1, wherein the hydrogen loading layer and the proton-conducting electrolyte form a stack having a thickness between about 10 nm and about 200 nm.

11. The reconfigurable mask of claim 1, wherein the first electrode, the second electrode, and the third electrode each have a thickness less than about 100 nm.

12. The reconfigurable mask of claim 1, wherein the first transmission, absorption, phase shift, and/or reflectivity and the second transmission, absorption, phase shift, and/or reflectivity correspond to a wavelength less than about 700 nm.

13. The reconfigurable mask of claim 1, wherein the water storage layer is transparent to wavelengths of light modulated by the reconfigurable mask.

14. The reconfigurable mask of claim 1, wherein the water storage layer comprises at least one of a transparent hydrogel or an oxide.

15. A lithography system comprising:
a light source to emit light;
a photoresist to receive a first portion of the light; and
the reconfigurable mask of claim 1, disposed between the light source and the photoresist, to receive the light and transmit the first portion of the light, the first portion of the light corresponding to the light transmitted through the first and second hydrogen loading regions,
wherein the second electrode and the third electrode of the reconfigurable mask are separated by a gap,
wherein the gap is at least one of (1) sufficiently small such that a second portion of the light is transmitted through the gap with an intensity insufficient to change a chemical structure of the photoresist or (2) filled with a material that prevents the transmission of the second portion of the light.

16. A lithography system comprising:
a reconfigurable mask comprising:
a first electrode porous or permeable to water, hydrogen, and/or hydrogen ions;
a second electrode;
a third electrode; and
a hydrogen loading layer, disposed between the first electrode and the second electrode and between the first electrode and the third electrode, comprising:
a first hydrogen loading region, disposed between the first electrode and the second electrode, having a first optical property that varies with a first concentration of hydrogen ions in the first hydrogen loading region; and
a second hydrogen loading region, disposed between the first electrode and the third electrode, having a second optical property that varies with a second concentration of hydrogen ions in the second hydrogen loading region; and
an enclosure, containing the reconfigurable mask, within which temperature and humidity level are precisely controlled.

17. The lithography system of claim 16, wherein the hydrogen loading layer is a patterned layer, and the first hydrogen loading region and the second hydrogen loading region are noncontinuous.

18. The lithography system of claim 16, wherein:
the first electrode is configured to split water into oxygen and hydrogen ions in response to a first voltage applied across the first electrode and the second electrode, the first voltage generating a first electric field to drive the hydrogen ions towards the first hydrogen loading region, to change the first concentration of hydrogen ions and the first optical property; and
the first electrode is configured to split water into oxygen and hydrogen ions in response to a second voltage applied across the first electrode and the third electrode, the second voltage generating a second electric field to drive the hydrogen ions towards the second hydrogen loading region, to change the second concentration of hydrogen ions and the second optical property.

* * * * *